(12) United States Patent
Koshihara

(10) Patent No.: US 10,168,533 B2
(45) Date of Patent: Jan. 1, 2019

(54) ELECTRO-OPTICAL APPARATUS AND ELECTRONIC DEVICE

(71) Applicant: SEIKO EPSON CORPORATION, Tokyo (JP)

(72) Inventor: Takeshi Koshihara, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 511 days.

(21) Appl. No.: 14/958,258

(22) Filed: Dec. 3, 2015

(65) Prior Publication Data

US 2016/0190520 A1 Jun. 30, 2016

(30) Foreign Application Priority Data

Dec. 25, 2014 (JP) ................. 2014-262962

(51) Int. Cl.
| | |
|---|---|
| G02B 27/01 | (2006.01) |
| H01L 51/52 | (2006.01) |
| H01L 27/32 | (2006.01) |
| G02B 27/22 | (2018.01) |

(52) U.S. Cl.
CPC ...... *G02B 27/0172* (2013.01); *H01L 27/3211* (2013.01); *H01L 51/5218* (2013.01); *H01L 51/5265* (2013.01); *H01L 51/5271* (2013.01); *G02B 27/22* (2013.01)

(58) Field of Classification Search
CPC ............ H01L 51/5265; H01L 51/5218; H01L 51/5271; H01L 27/3211; G02B 27/0172; G02B 2027/0118
See application file for complete search history.

(56) References Cited

U.S. PATENT DOCUMENTS

| | | | |
|---|---|---|---|
| 2004/0070808 A1 | 4/2004 | Nakanishi | |
| 2012/0228603 A1* | 9/2012 | Nakamura | ............ H01L 27/322 |
| | | | 257/40 |
| 2012/0243219 A1 | 9/2012 | Ohsawa et al. | |
| 2013/0307006 A1* | 11/2013 | Koshihara | ............ H01L 33/405 |
| | | | 257/98 |

FOREIGN PATENT DOCUMENTS

| | | |
|---|---|---|
| JP | 2005-321815 A | 11/2005 |
| JP | 2007-059116 A | 3/2007 |
| JP | 2008-218330 A | 9/2008 |
| JP | 2010-198754 A | 9/2010 |
| JP | 2010-211984 A | 9/2010 |

(Continued)

*Primary Examiner* — Kevin Quarterman
(74) *Attorney, Agent, or Firm* — Oliff PLC

(57) ABSTRACT

There is provided an electro-optical apparatus including an element substrate that includes a display region in which a plurality of pixels, which are light-emitting elements, are arranged in a matrix form. The light-emitting element has a structure in which a reflective electrode, a protective layer, an optical path adjustment layer, a first electrode, a light-emitting layer, and a second electrode are laminated on an insulation layer. The reflective electrode is disposed by being split in each pixel, and a gap is formed between each reflective electrode that is disposed by being split in each pixel. The protective layer covers the surface of the reflective electrode on which the gap is formed, and includes an embedded insulation film which is embedded in the gap.

19 Claims, 12 Drawing Sheets

(56) References Cited

FOREIGN PATENT DOCUMENTS

| | | | |
|---|---|---|---|
| JP | 2010-272447 | A | 12/2010 |
| JP | 2010-287543 | A | 12/2010 |
| JP | 2012-48992 | A | 3/2012 |
| JP | 2012-216519 | A | 11/2012 |
| JP | 2013-089444 | A | 5/2013 |
| JP | 2013-109996 | A | 6/2013 |
| JP | 2013-238725 | A | 11/2013 |

* cited by examiner

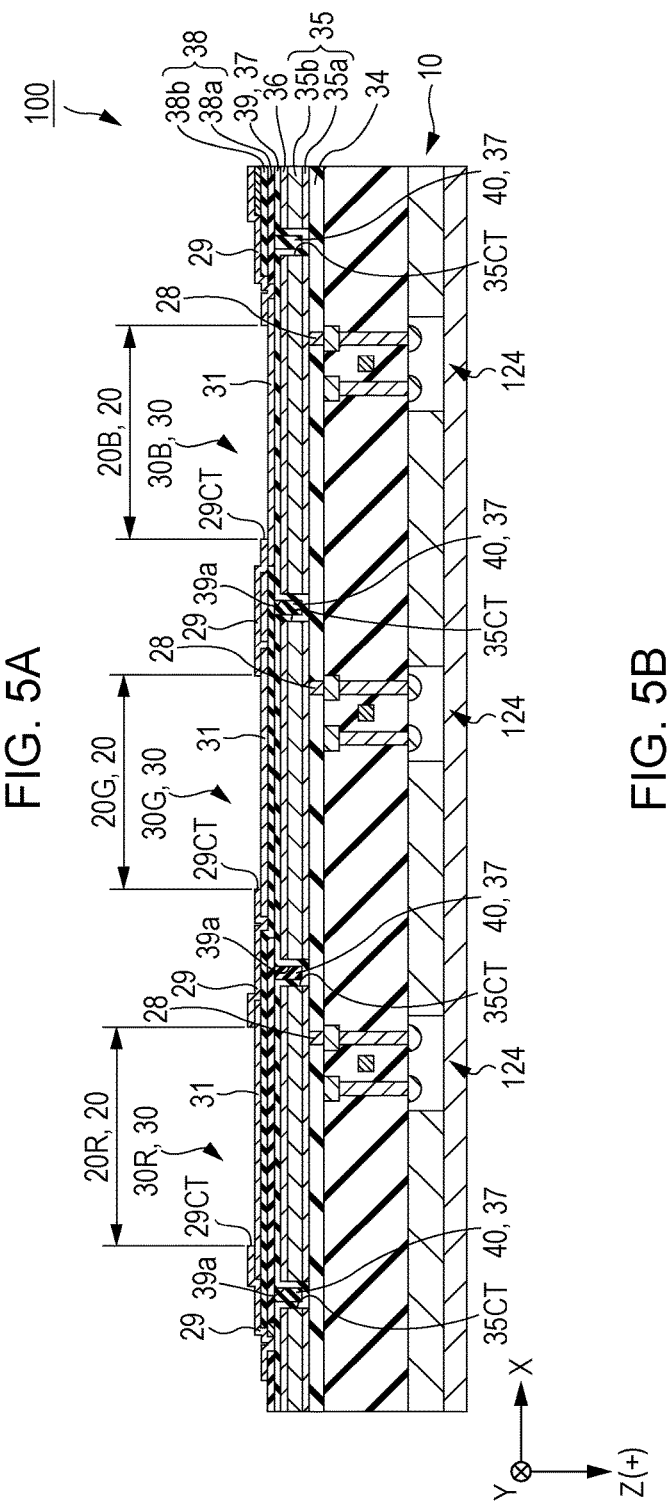
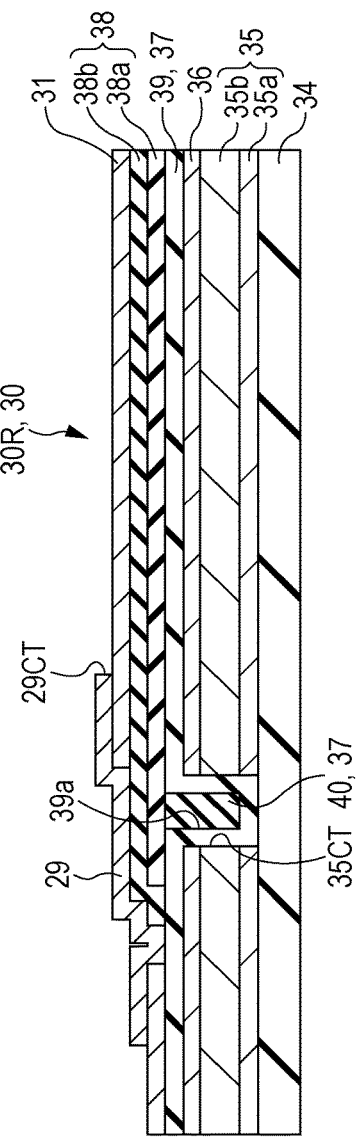
FIG. 5A
FIG. 5B

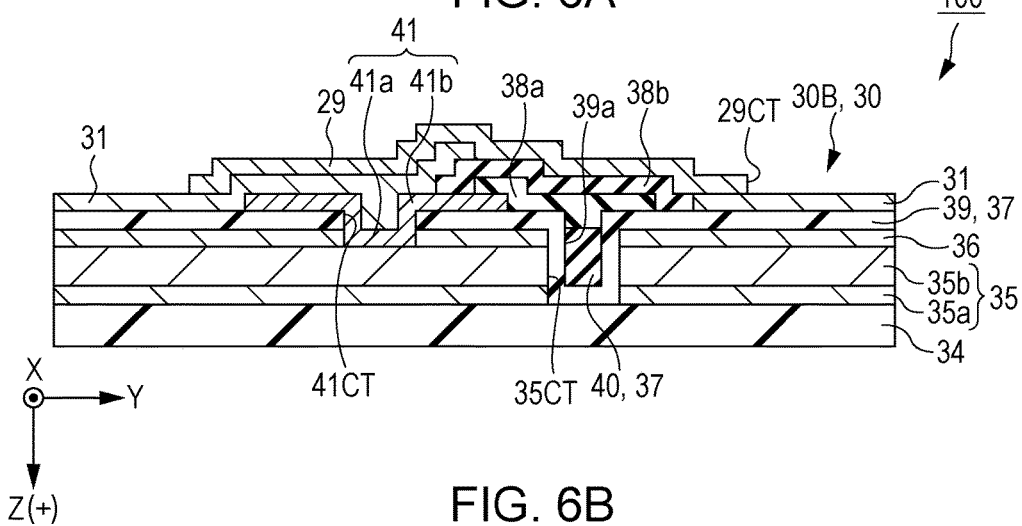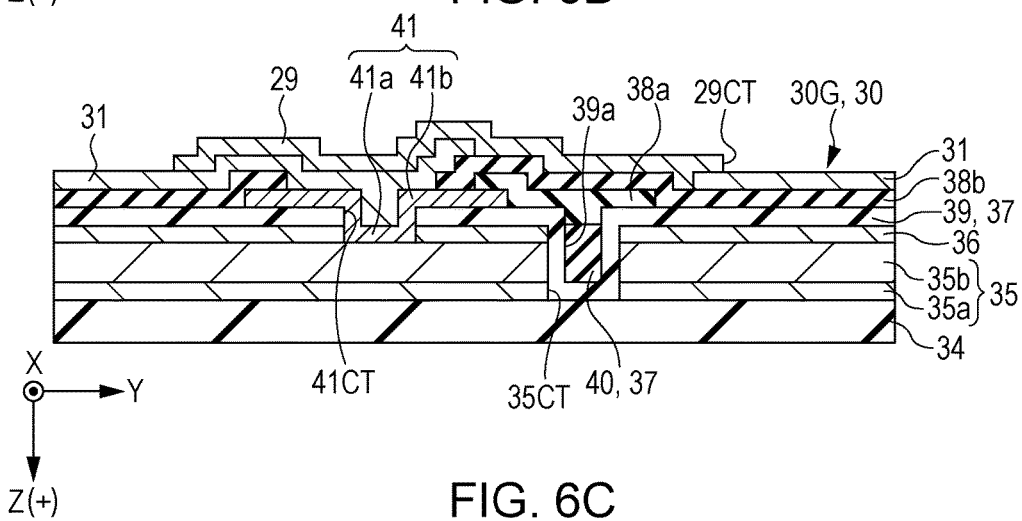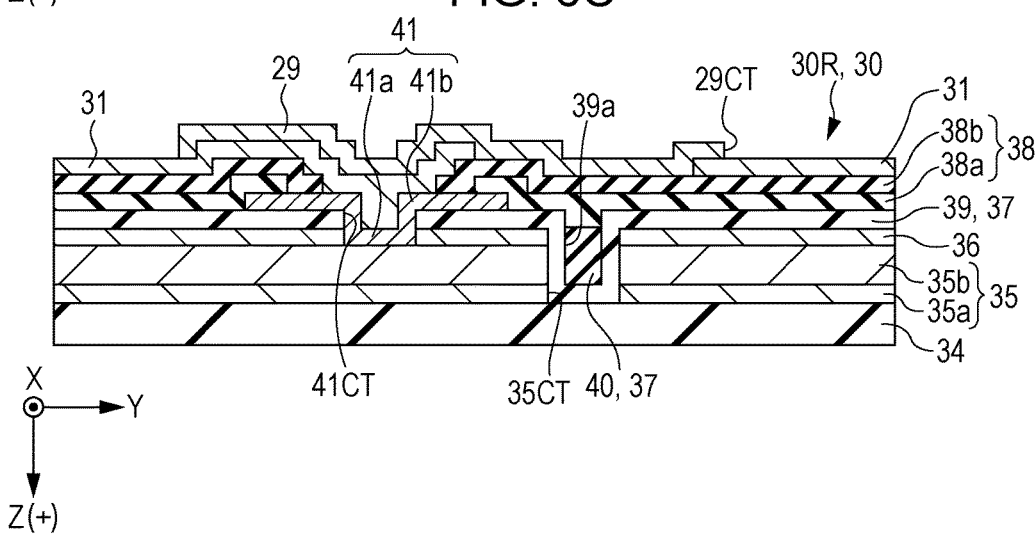

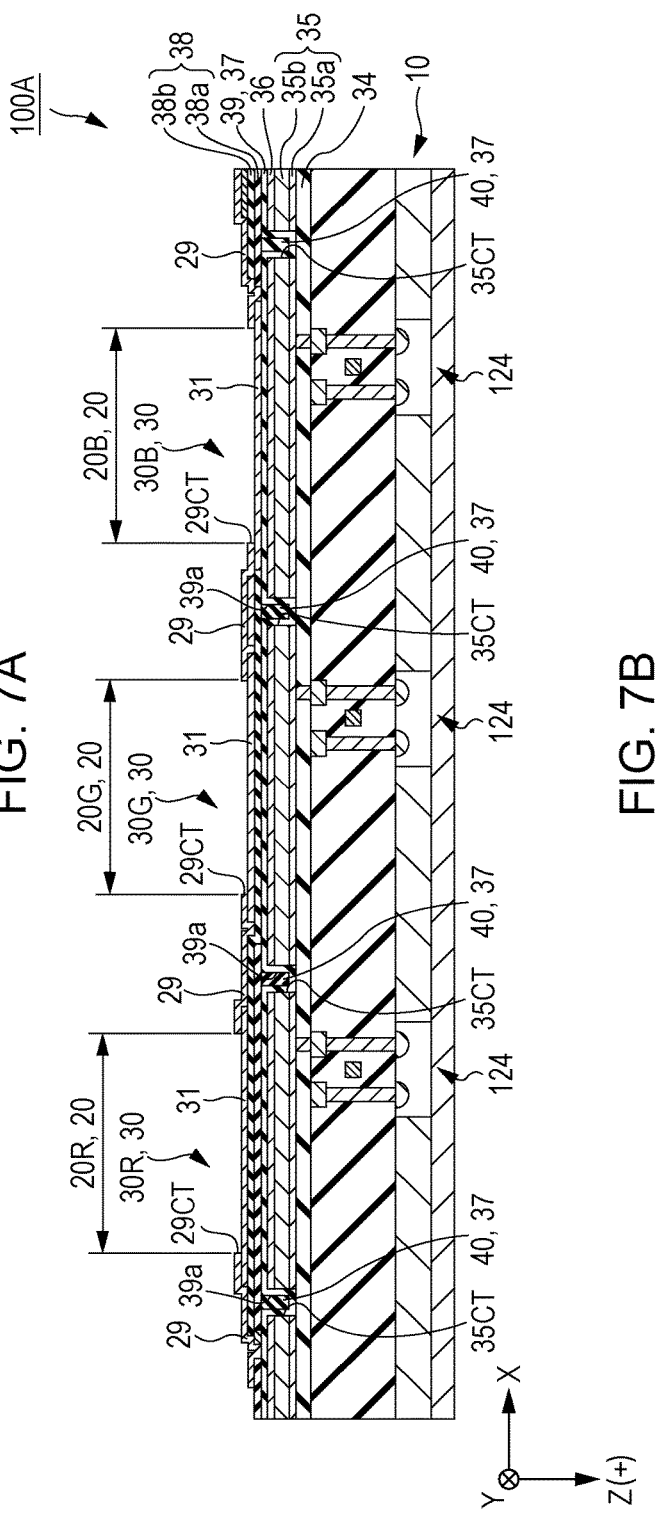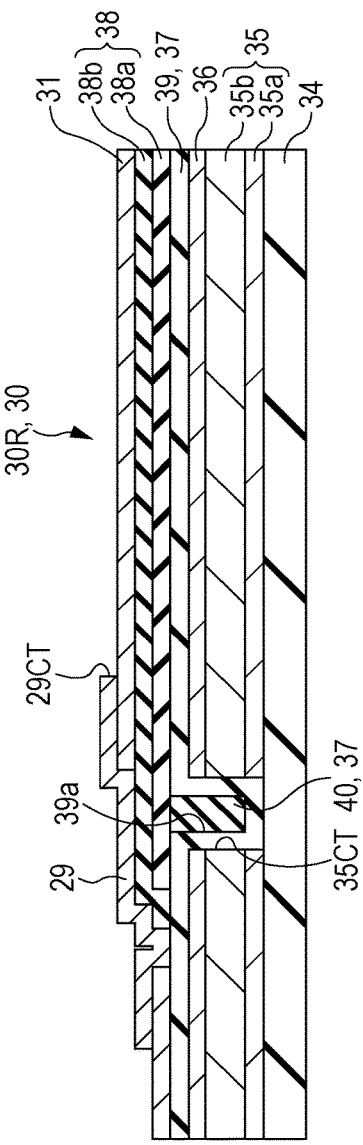

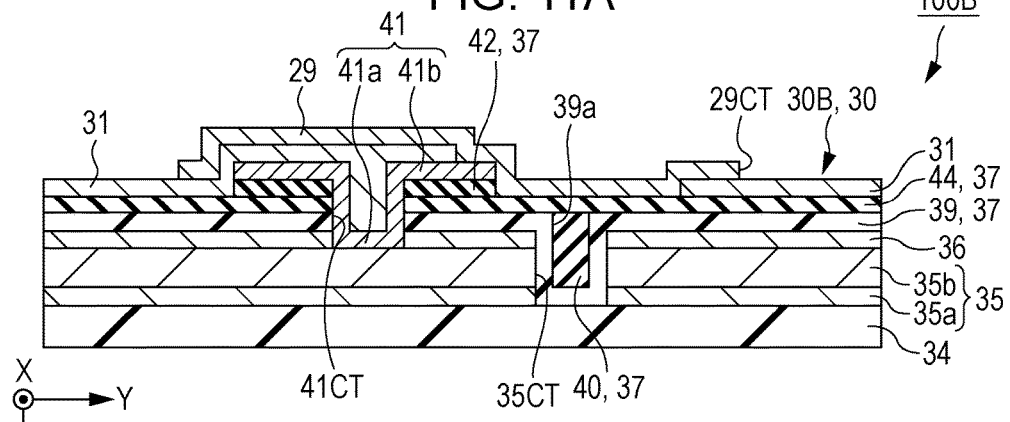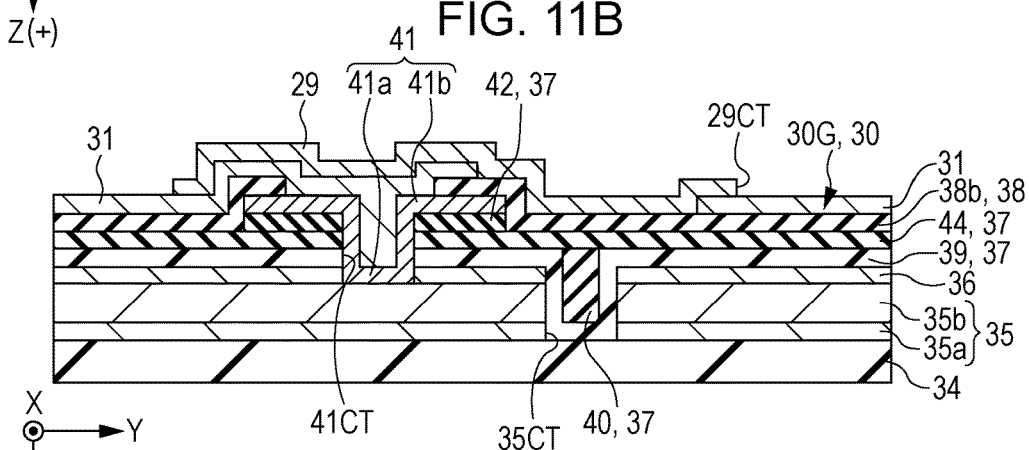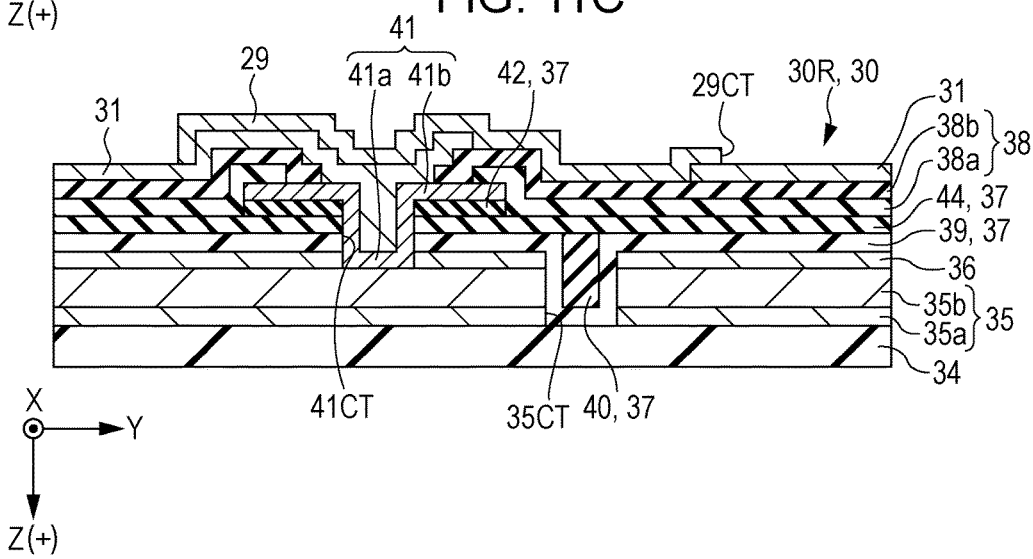

ELECTRO-OPTICAL APPARATUS AND ELECTRONIC DEVICE

BACKGROUND

1. Technical Field

The present invention relates to an electro-optical apparatus and an electronic device.

2. Related Art

An organic electro luminescence (EL) apparatus, in which pixels that use an organic EL element are disposed in a matrix form in a display region of an element substrate, is proposed as an example of the electro-optical apparatus (for example, refer to JP-A-2005-321815 and JP-A-2013-089444).

In detail, JP-A-2005-321815 discloses a top emission structure organic EL apparatus that is provided with an organic EL element in which a first electrode (pixel electrode), a light-emitting layer, and a second electrode (counter electrode) are laminated in that order, a power supply line which is electrically connected to the first electrode, and a switching element (transistor) that switches the electrical connection of the first electrode and the power supply line, which is disposed such that the first electrode is superimposed on the power supply line (reflective layer) which has light reflectivity.

Meanwhile, JP-A-2013-089444 discloses an organic EL apparatus which is provided with an organic EL element with a resonant structure (cavity structure) in which a reflective layer, an optical path adjustment layer, a first electrode (pixel electrode), a light-emitting layer, and a second electrode (counter electrode) are laminated in that order, and light is emitted by increasing the strength of light of a specific wavelength (resonant wavelength) according to an optical distance between the reflective layer and the second electrode which is adjusted according to the optical path adjustment layer while light which is emitted in the light-emitting layer is repeatedly reflected between the reflective layer and the second electrode.

Here, an opening is formed between each reflective electrode that is disposed in each pixel in the organic EL apparatus which is described above in JP-A-2013-089444. The optical path adjustment layer is disposed so as to cover the surface of the reflective electrode on which the opening is formed. For this reason, a concave section (concavities and convexities) which reflects the shape of the opening is formed in the optical path adjustment layer.

However, it is difficult to accurately perform optical path adjustment between the reflective electrode and the first electrode using the optical path adjustment layer at a position where such a concave section is formed and in the vicinity thereof. In addition, in order for the first electrode which is disposed on the optical path adjustment layer to avoid influence by the concave section, it is necessary to reduce the size of the reflective electrode. Accordingly, a light-emitting area (pixel aperture ratio) is reduced by the amount by which the first electrode is smaller than the reflective electrode.

SUMMARY

An advantage of some aspects of the invention is to provide an electro-optical apparatus which is able to accurately perform optical path adjustment between a reflective electrode and a first electrode, and is able to increase the pixel aperture ratio, and an electronic device provided with such an electro-optical apparatus.

An electro-optical apparatus according to an aspect of the invention includes an element substrate that includes a display region in which a plurality of pixels are arranged in a matrix form. The element substrate has a light-emitting element and a transistor which drives the light-emitting element in each pixel. The light-emitting element is disposed via an insulation layer on the transistor, and has a structure in which a reflective electrode, a protective layer, an optical path adjustment layer, a first electrode, a light-emitting layer, and a second electrode are laminated. The reflective electrode is disposed by being split in each pixel. A gap is formed between each reflective electrode that is disposed by being split in each pixel. The protective layer includes an embedded insulation film which is embedded in the gap.

According to this configuration, since the surface of the protective layer on the side which comes in contact with the optical path adjustment layer is flattened, it is possible to accurately perform optical path adjustment between the reflective electrode and the first electrode by adjusting the thickness of the optical path adjustment layer in each pixel. Thereby, it is possible to perform a light-emitting operation for a light-emitting element with good color reproducibility using a resonant structure. In addition, according to this configuration, since the optical path adjustment layer which is disposed on the surface of the protective layer is flattened, it is possible to position an end section of the first electrode which is disposed on the surface of the optical path adjustment layer close to an end section of the reflective electrode. Thereby, it is possible to increase the light-emitting area (pixel aperture ratio).

In addition, the electro-optical apparatus may have a configuration in which the transistor and the reflective electrode are electrically connected via a first contact electrode which is disposed so as to pass through the insulation layer, and the reflective electrode and the first electrode are electrically connected via a second contact electrode which is disposed so as to pass through the protective layer.

According to this configuration, since the transistor and the first electrode are electrically connected via the reflective electrode, the reflective electrode and the first electrode have the same potential. Thereby, it is possible to perform the light-emitting operation of the light-emitting element with high reliability while controlling the potential which is applied from the transistor to the first electrode via the reflective electrode. In addition, according to this configuration, it is possible to achieve a further improvement in yield.

In addition, the electro-optical apparatus may have a configuration in which the protective layer includes a first insulation film which is provided between the reflective electrode and an embedded insulation film and a second insulation film which is provided on the first insulation film and the embedded insulation film, and the optical path adjustment layer is disposed such that an end section of at least a portion is positioned on the surface of the second insulation film.

According to this configuration, it is possible for the second insulation film to function as an etching stopper for the optical path adjustment layer while protecting the embedded insulation film when patterning is carried out on the optical path adjustment layer in a predetermined shape.

In addition, the electro-optical apparatus may have a configuration in which the second insulation film contains silicon nitride and the optical path adjustment layer contains silicon oxide.

According to this configuration, it is possible to selectively etch silicon oxide with respect to silicon nitride by, for example, dry etching using fluorine-based gas. Accordingly, it is possible for the second insulation film to function as an etching stopper for the optical path adjustment layer when patterning is carried out on the optical path adjustment layer in a predetermined shape.

In addition, the electro-optical apparatus may have a configuration in which an end section of at least a portion of the optical path adjustment layer is positioned above the embedded insulation film.

According to this configuration, it is possible for the second insulation film to function as an etching stopper for the optical path adjustment layer and it is possible to increase the aperture ratio of each pixel while protecting the embedded insulation film when patterning is carried out on the optical path adjustment layer in a predetermined shape.

In addition, the electro-optical apparatus may have a configuration in which a contact hole is formed which passes through the optical path adjustment layer and the protective layer, and the second contact electrode has a first contact section which is connected to the reflective electrode in a state of being embedded in the contact hole and a second contact section which is connected to the first electrode in a state of being disposed on the surface of the protective layer.

According to this configuration, it is possible to effectively connect the reflective electrode and the first electrode via the second contact electrode.

In addition, the electro-optical apparatus may have a configuration in which an end section of at least a portion of the optical path adjustment layer is positioned on the surface of the second contact electrode.

According to this configuration, it is possible for the second contact electrode to function as an etching stopper for the optical path adjustment layer and it is possible to increase the aperture ratio of each pixel when patterning is carried out on the optical path adjustment layer in a predetermined shape.

In addition, the electro-optical apparatus may have a configuration in which a reflection enhancing layer is disposed on the surface of the reflective electrode.

According to this configuration, it is possible to increase reflectivity using the reflective electrode.

In addition, an electronic device according to another aspect of the invention includes any of the electro-optical apparatuses.

According to this configuration, it is possible to accurately perform optical path adjustment between the reflective electrode and the first electrode, and it is possible to provide an electronic device including the electro-optical apparatus which is able to increase the aperture ratio of the pixels.

An electro-optical apparatus according to an aspect of the invention includes An electro-optical apparatus having a first pixel and a second pixel, the electro-optical apparatus comprises a substrate, a counter electrode, a light-emitting layer disposed between the counter electrode and the substrate, an optical path adjustment layer disposed between the light-emitting layer and the substrate, a protective layer disposed between the optical path adjustment layer and the substrate, a first reflective electrode disposed between the protective layer and the substrate in the first pixel, a first pixel electrode disposed between the light-emitting layer and the optical path adjustment layer in the first pixel, a second reflective electrode disposed between the protective layer and the substrate in the second pixel, the surface of the first reflective electrode and second reflective electrode being covered by the protective layer, a second pixel electrode disposed between the light-emitting layer and the optical path adjustment layer in the second pixel, an embedded insulation film. The surface of the first reflective electrode and second reflective electrode is covered by the protective layer. The embedded insulation film is disposed between the first reflective electrode and second reflective electrode.

In addition, the embedded insulation may be disposed between the protective layer and at least part of the optical path adjustment layer.

In addition, an end section of at least a portion of the optical path adjustment layer is positioned above the embedded insulation film.

BRIEF DESCRIPTION OF THE DRAWINGS

The invention will be described with reference to the accompanying drawings, wherein like numbers reference like elements.

FIG. 2 is a circuit diagram illustrating a configuration of an element substrate which the organic EL apparatus that is illustrated in FIG. 1 is provided with.

FIG. 3 is a circuit diagram illustrating a configuration of a pixel circuit which the organic EL apparatus that is illustrated in FIG. 1 is provided with.

FIG. 4 is a planar view illustrating a configuration of a pixel which the organic EL apparatus that is illustrated in FIG. 1 is provided with.

FIG. 5A is a sectional view according to a first embodiment using a line segment VA-VA which is illustrated in FIG. 4, and FIG. 5B is an enlarged sectional view of a portion of the pixel which is illustrated in FIG. 5A.

FIG. 6A is a sectional view according to the first embodiment using a line segment VIA-VIA which is illustrated in FIG. 4, FIG. 6B is a sectional view according to the first embodiment using a line segment VIB-VIB which is illustrated in FIG. 4, and FIG. 6C is a sectional view according to the first embodiment using a line segment VIC-VIC which is illustrated in FIG. 4.

FIG. 7A is a sectional view according to a second embodiment using the line segment VIIA-VIIA which is illustrated in FIG. 4, and FIG. 7B is an enlarged sectional view of a portion of the pixel which is illustrated in FIG. 7A.

FIG. 11A is a sectional view according to the third embodiment using the line segment XIA-XIA which is illustrated in FIG. 4, FIG. 11B is a sectional view according to the third embodiment using the line segment XIB-XIB which is illustrated in FIG. 4, and FIG. 11C is a sectional view according to the third embodiment using the line segment XIC-XIC which is illustrated in FIG. 4.

DESCRIPTION OF EXEMPLARY EMBODIMENTS

Figure 1:
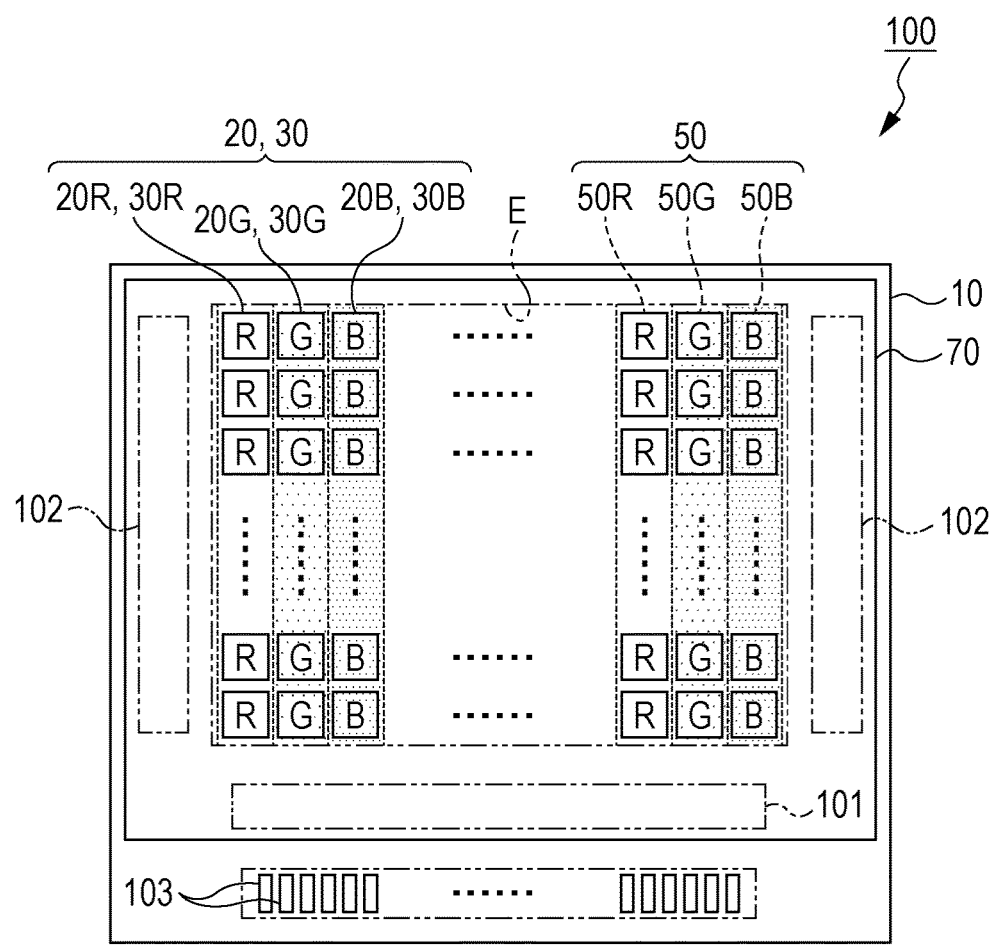
FIG. 1 is a planar view illustrating a configuration of an organic EL apparatus according to an embodiment of the invention.

Embodiments of the invention will be described in detail below with reference to the drawings.

Here, the present embodiment illustrates an aspect of the invention, but is not limited to the invention, and is able to be arbitrarily modified within the scope of the technical concept of the invention. In addition, in each of the drawings described below, the scale of each layer and each part is different from the actual size in order for the sizes of each layer and each part to be to the extent so as to be recognizable in the drawings.

First Embodiment

Organic EL Apparatus

An organic EL apparatus 100 shown in FIG. 1 which is a first embodiment of the invention is a self-luminous type display apparatus which is illustrated as an example of an "electro-optical apparatus" in the invention. Here, FIG. 1 is a planar view schematically illustrating a configuration of the organic EL apparatus 100.

First, a summary of the organic EL apparatus 100 according to the present embodiment will be described with reference to FIG. 1.

As shown in FIG. 1, the organic EL apparatus 100 has an element substrate 10 and a protective substrate 70. The element substrate 10 and the protective substrate 70 are joined using an adhesive which is omitted from the drawings in a state of facing each other. Here, for the adhesive it is possible use, for example, epoxy resin, acrylic resin, or the like.

As a light-emitting element, the element substrate 10 has a display region E in which a pixel 20B on which an organic EL element 30B that emits blue (B) light is disposed, a pixel 20G on which an organic EL element 30G that emits green (G) light is disposed, and a pixel 20R on which an organic EL element 30R that emits red (R) light is disposed are arranged in a matrix form.

The organic EL apparatus 100 is provided with a full color display in which the pixel 20B, the pixel 20G, and the pixel 20R are the display units. Here, in the description below, there are cases in which the pixel 20B, the pixel 20G, and the pixel 20R are treated collectively as a pixel 20, and there are cases in which the organic EL element 30B, the organic EL element 30G, and the organic EL element 30R are treated collectively as an organic EL element 30.

A color filter layer 50 is provided in the display region E. Within the color filter layer 50 a blue color filter layer 50B is disposed on the organic EL element 30B of the pixel 20B, a green color filter layer 50G is disposed on the organic EL element 30G of the pixel 20G, and a red color filter layer 50R is disposed on the organic EL element 30R of the pixel 20R.

In the embodiment, the pixels 20 in which emitted light of each color is obtained are arranged in the Y direction (first direction), and the pixels 20 in which emitted light of different colors is obtained are arranged in the X direction (second direction) which intersects with (is orthogonal to) the Y direction. Accordingly, the disposition of the pixels 20 is a so-called stripe method. According to the arrangement of the pixels, the organic EL element 30B, the organic EL element 30G, and the organic EL element 30R are each disposed in a stripe form, and the blue color filter layer 50B, the green color filter layer 50G, and the red color filter layer 50R are also disposed in a stripe form. Here, the disposition of the pixels 20 is not limited to the stripe method, and may be a mosaic method or a delta method.

The organic EL apparatus 100 has a top emission structure. Accordingly, light which is emitted by the organic EL element 30 passes through the color filter layer 50 of the element substrate 10 and is emitted as display light from the protective substrate 70 side.

Since the organic EL apparatus 100 has a top emission structure, it is possible to use an opaque ceramic substrate, a semiconductor substrate, or the like in addition to a transparent quartz substrate, a glass substrate, or the like as the base material of the element substrate 10. Here, in the embodiment, a silicon substrate (semiconductor substrate) is used as the element substrate 10.

A plurality of external connection terminals 103 are arranged along a side of the long side of the element substrate 10 outside the display region E. A data line driving circuit 101 is provided between the plurality external connection terminals 103 and the display region E. A scanning line driving circuit 102 is provided between two sides of the short side of the element substrate 10 and the display region E. Here, in the description below, a direction along the long side of the element substrate 10 is the X direction, a direction along the short side of the element substrate 10 is the Y direction, and a direction from the protective substrate 70 toward the element substrate 10 is the Z(+) direction.

The protective substrate 70 is smaller than the element substrate 10, and is disposed facing the element substrate 10 such that the external connection terminals 103 are exposed. The external connection terminals 103 are connected to a flexible wiring substrate 104. Thereby, the organic EL apparatus 100 is able to be electrically connected to an external circuit (not shown in the drawings) via the flexible wiring substrate 104.

The protective substrate 70 is a substrate with light transmissivity, and is able to use a quartz substrate, a glass substrate, or the like. The protective substrate 70 has a role of protecting the organic EL element 30 which is arranged in the display area E from damage, and is provided so as to be wider than the display region E.

Figure 2:
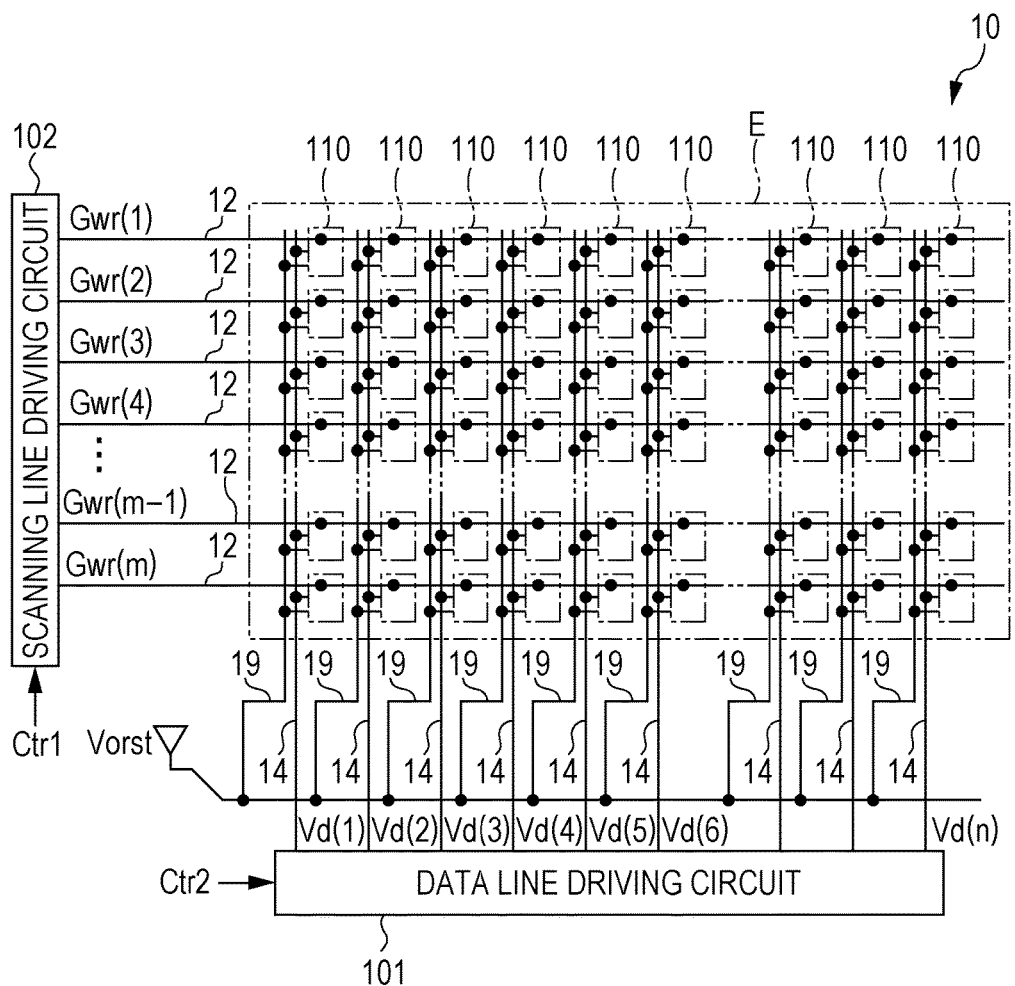

FIG. 2 is a circuit view illustrating a configuration of the element substrate 10. As shown in FIG. 2, on the element substrate 10, m rows of scanning lines 12 are provided extending in the X direction, and n columns of data lines 14 are provided extending in the Y direction. In addition, on the element substrate 10, a power supply line 19 is provided extending in the Y direction in each column along the data lines 14.

Pixel circuits 110 corresponding to intersection sections of m rows of scanning lines 12 and n columns of data lines 14 are provided on the element substrate 10. The pixel circuits 110 form a portion of the pixels 20. m rows×n columns of the pixel circuits 110 are arranged in a matrix form in the display region E.

A reset potential for initialization Vorst is supplied (fed) to the power supply line 19. Furthermore, although omitted from the drawings, three control lines which supply control signals Gcmp, Gel, and Gorst are provided in parallel to the scanning lines 12.

The scanning lines 12 are electrically connected to the scanning line driving circuit 102. The data lines 14 are electrically connected to the data line driving circuit 101. A control signal Ctr1 for controlling the scanning line driving circuit 102 is supplied to the scanning line driving circuit 102. A control signal Ctr2 for controlling the data line driving circuit 101 is supplied to the data line driving circuit 101.

The scanning line driving circuit 102 generates scanning signals Gwr(1), Gwr(2), Gwr(3), . . . , Gwr(m−1), Gwr(m) in order to scan the scanning lines 12 over a period of a frame in each row according to the control signal Ctr1. Furthermore, in addition to the scanning signal Gwr, the scanning line driving circuit 102 supplies the control signals Gcmp, Gel, and Gorst to the control lines. Here, the frame period is a period in which an image of one cut (frame) is displayed using the organic EL apparatus 100, and for example, if the frequency of a vertical synchronization signal which includes a synchronization signal is 120 Hz, one frame period is approximately 8.3 milliseconds.

The data line driving circuit 101 supplies data signals Vd(1), Vd(2), . . . , Vd(n) according to gradation data of the pixel circuit 110 to the data lines 14 of 1, 2, . . . , n columns with respect to the pixel circuit 110 which is positioned in a row that is selected by the scanning line driving circuit 102.

Figure 3:
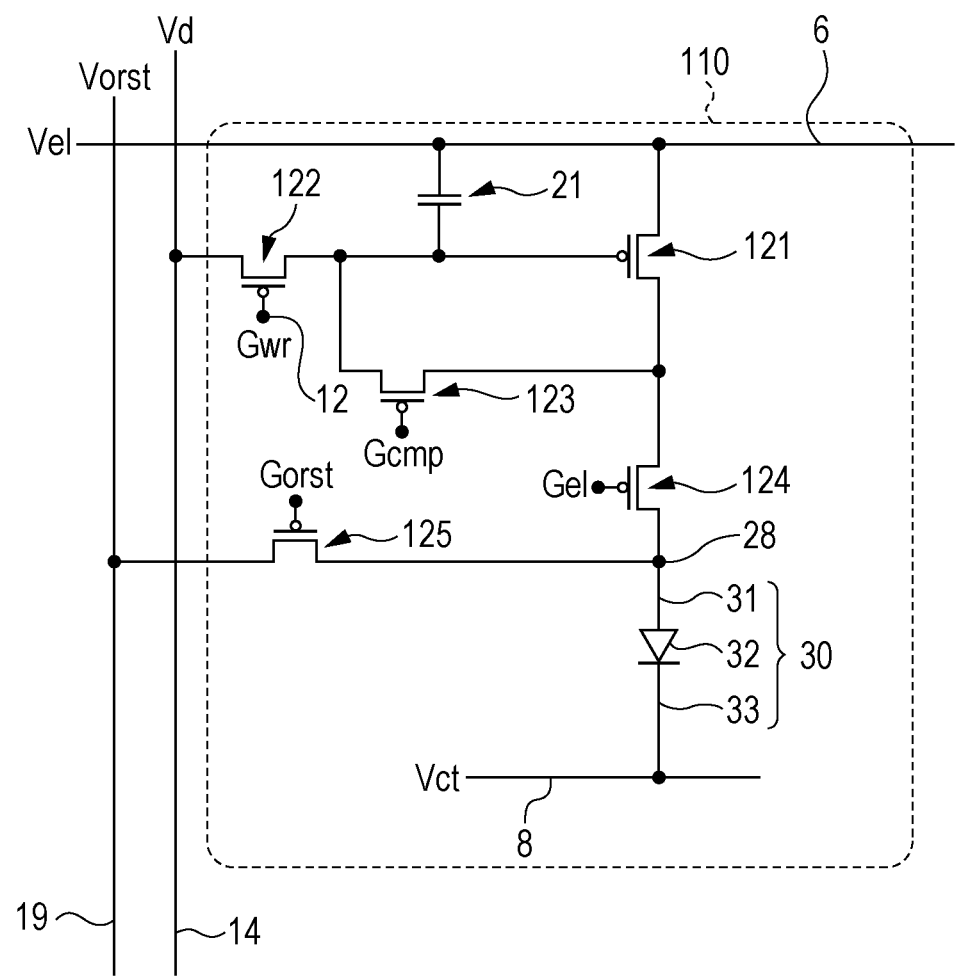

FIG. 3 is a circuit view illustrating a configuration of the pixel circuit 110. As shown in FIG. 3, the pixel circuit 110 has P-channel MOS transistors 121, 122, 123, 124, and 125, the organic EL element 30, and a capacitor 21. The scanning signal Gwr, the control signals Gcmp, Gel, Gorst, and the like described above are supplied to the pixel circuit 110.

The organic EL element 30 has a structure in which a light-emitting function layer (light-emitting layer) 32 is interposed by a pixel electrode (first electrode) 31 and a counter electrode (second electrode) 33 which face each other.

The pixel electrode 31 is an anode which supplies a positive hole in the light-emitting function layer 32, and is formed using a conductive material which has light permeability. In the embodiment, an indium tin oxide (ITO) film with a film thickness of, for example, 200 nm is formed as the pixel electrode 31. The pixel electrode 31 is electrically connected to a drain of the transistor 124 and one of a source or a drain of the transistor 125.

The counter electrode 33 is a cathode which supplies electrons to the light-emitting function layer 32, and is formed using a conductive material which has light permeability and light reflectivity such as, for example, an alloy of magnesium (Mg) and gold (Ag). The common electrode 33 is a common electrode which is provided over a plurality of pixels 20, and is electrically connected to a power supply line 8. A potential Vct which is the lowest potential power source in the pixel circuit 110 is supplied in the power supply line 8.

The light-emitting function layer 32 has a positive hole injection layer, a positive hole transport layer, an organic light-emitting layer, an electron transport layer, and the like laminated in that order from the pixel electrode 31 side. In the organic EL element 30, the light-emitting function layer 32 emits light by the positive hole which is supplied from the pixel electrode 31 and the electrons which are supplied form the counter electrode 33 being joined in the middle of the light-emitting function layer 32.

In addition, a power supply line 6 which intersects with each power supply line 19 is provided on the element substrate 10 so as to extend in the X direction. Here, the power supply line 6 may be provided so as to extend in the Y direction, and may be provided so as to extend in both the X direction and the Y direction. The transistor 121 is electrically connected to the power supply line 6 by the source, and is respectfully electrically connected to the other of the source or drain of the transistor 123 and the source of the transistor 124. In addition, a potential Vel which is the highest potential power source in the pixel circuit 110 is supplied in the power supply line 6. In addition, one end of the capacitor 21 is electrically connected to the power supply line 6. The transistor 121 functions as a driving transistor through which current flows according to the voltage between a gate and the source of the transistor 121.

The transistor 122 is electrically connected to the scanning lines 12 by the gate, and one of the source or the drain are electrically connected to the data lines 14. In addition, the other of the source or the drain of the transistor 122 is respectively electrically connected to the gate of the transistor 121, the other capacitor 21, and one of the source or the drain of the transistor 123. The transistor 122 is electrically connected between the gate of the transistor 121 and the data lines 14, and functions as a write-in transistor which controls the electrical connection between the gate of the transistor 121 and the data lines 14.

The transistor 123 is electrically connected to the control line by the gate, and is supplied with the control signal Gcmp. The transistor 123 controls the electrical connection between the gate and the drain of the transistor 121, and functions as a threshold compensation transistor.

The transistor 124 is electrically connected to the control line by the gate, and is supplied with the control signal Gel. The drain of the transistor 124 is respectively electrically connected to one of the source or the drain of the transistor 125 and the pixel electrode 31 of the organic EL element 30. The transistor 124 controls the electrical connection between the drain of the transistor 121 and the pixel electrode 31 of the organic EL element 30, and functions as a light-emission control transistor.

The transistor 125 is electrically connected to the control line by the gate, and is supplied with the control signal Gorst. In addition, the other of the source or the drain of the transistor 125 is electrically connected to the power supply line 19, and is supplied with the reset potential Vorst. The transistor 125 functions as an initialization transistor which controls the electrical connection between the power supply line 19 and the pixel electrode 31 of the organic EL element 30.

Figure 4:
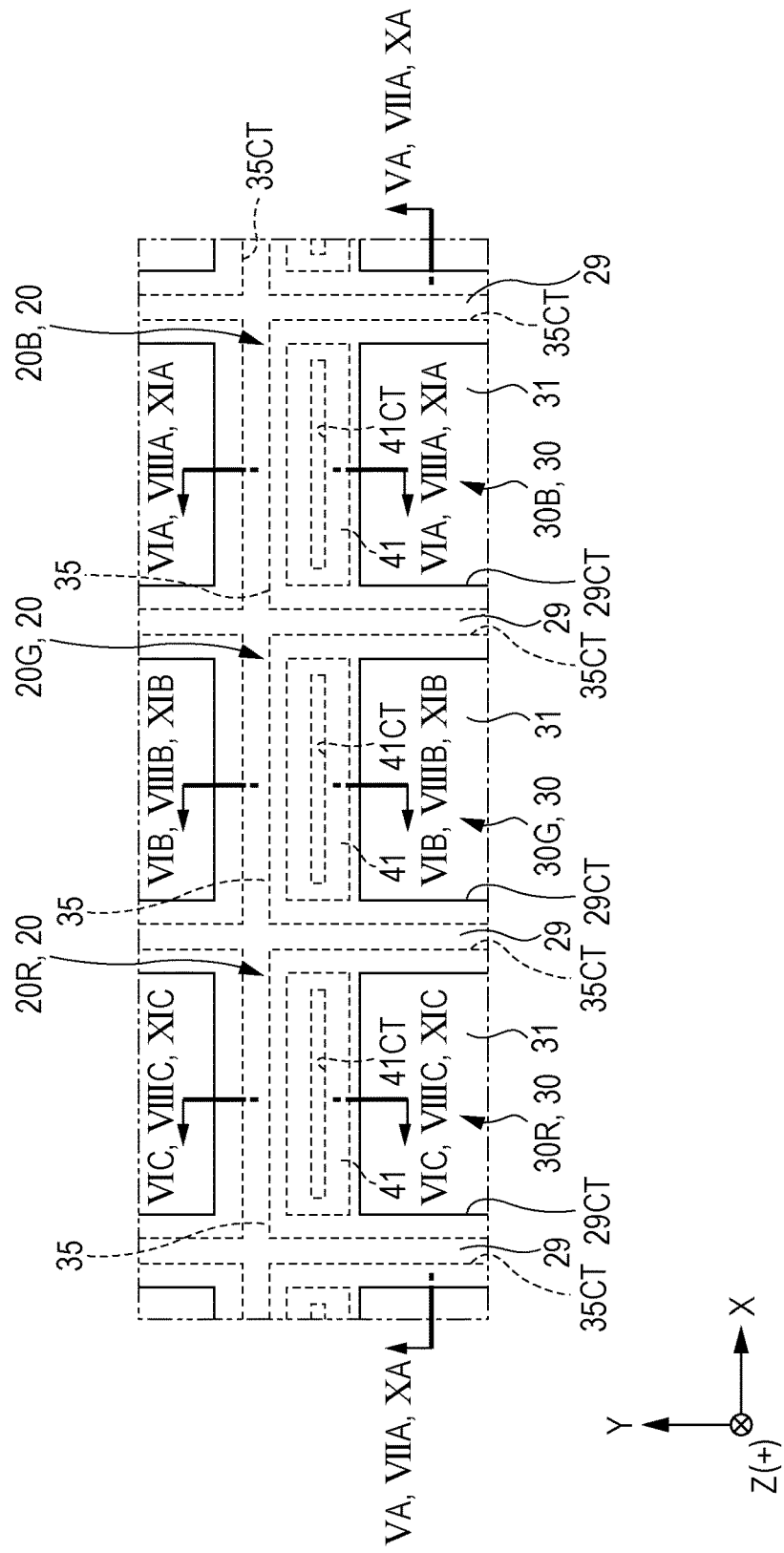

FIG. 4 is a planar view illustrating a configuration of the pixels 20 (pixels 20B, 20G, and 20R). FIG. 5A is a sectional view along the X direction of the pixels 20B, 20G, and 20R using a line segment VA-VA which is illustrated in FIG. 4. FIG. 5B is an enlarged sectional view of a portion of the pixel 20R which is illustrated in FIG. 5A. FIG. 6A is a sectional view along the Y direction of the pixel 20B using a line segment VIA-VIA which is illustrated in FIG. 4. FIG. 6B is a sectional view along the Y direction of the pixel 20G using a line segment VIB-VIB which is illustrated in FIG. 4. FIG. 6C is a sectional view along the Y direction of the pixel 20R using a line segment VIC-VIC which is illustrated in FIG. 4.

As shown in FIGS. 4, 5A, and 5B, each of the pixels 20B, 20G, and 20R are disposed such that a short direction is parallel to the X direction (a long direction is parallel to the Y direction) in order to respectively take a rectangular shape in planar view. In addition, the pixel separation layer 29 is provided among each of the organic EL elements 30B, 30G, and 30R.

The pixel separation layer 29 is made from an insulation layer, and electrically insulates between the adjacent organic EL elements 30B, 30G, and 30R. In the embodiment, a silicon oxide ($SiO_2$) film with, for example, a film thickness of 25 nm is formed as the pixel separation layer 29. The pixel separation layer 29 is provided so as to cover the peripheral edge section of the pixel electrode 31 of each of the pixels 20B, 20G, and 20R. That is, an opening 29CT which exposes a portion of the pixel electrode 31 of each of the pixels 20B, 20G, and 20R is provided in the pixel separation layer 29. The opening 29CT specifies a light-emitting region of each of the pixels 20 in order to take a rectangular shape in planar view.

As shown in FIGS. 5A, 5B, and 6A to 6C, the organic EL elements 30B, 30G, and 30R which are disposed respectively in the pixels 20B, 20G, and 20R have a resonant structure (cavity structure) in which a reflective electrode 35, a reflection enhancing layer 36, a protective layer 37, an optical path adjustment layer 38, the first electrode 31, the light-emitting layer 32, and the second electrode 33 are laminated on an interlayer insulation layer (insulation layer) 34. Here, in FIGS. 4, 5A, 5B, and 6A to 6C, illustration is omitted of the light-emitting function layer 32 and the counter electrode 33 which are described above.

In the resonant structure, it is possible to emit light by increasing the strength of light of a specific wavelength (resonant wavelength) according to an optical distance between the reflective layer 35 and the second electrode 33 which is adjusted according to the optical path adjustment layer 38 while light which is emitted by the light-emitting layer 32 is repeatedly reflected between the reflective layer 35 and the counter electrode 33.

For example, an insulating material such as silicon oxide ($SiO_2$) is used in the interlayer insulation layer 34. Here, in FIG. 5A, although only the transistor 124 is indicated below the interlayer insulation layer 34, other than the transistor 124, the transistors 121, 122, 123, 124, and 125, which are configured by the scanning lines 12, the data lines 14, the power supply line 19, the control line, the power supply line 6, and the pixel circuit 110, the capacitor 21, and the like are disposed below the interlayer insulation layer 34. There is a possibility that concavities and convexities are formed on the surface of the interlayer insulation layer 34 according to the transistor, a wiring, or the like, but it is preferable to flatten the surface on which the reflective electrode 35 is formed.

The reflective electrode 35 is disposed by being split in each pixel 20. That is, the reflective electrode 35 is provided in each of the pixels 20B, 20G, and 20R. In addition, a gap 35CT is formed between each adjacent reflective electrode 35. Accordingly, the gap 35CT is formed between each adjacent reflective electrode 35, is electrically separate from each pixel 20, and is configured such that a different potential is appliable.

The reflective electrode 35 is made from a conductive material which has light reflectivity, and is formed in a rectangular shape in planar view. The reflective electrode 35 is larger than the pixel electrode 31, and specifies a reflection region for each pixel 20. In the embodiment, for example, an alloy of aluminum (Al) and copper (Cu) (AlCu) with a film thickness of 100 nm which is a second layer 35b is formed on a titanium (Ti) film with a film thickness of 30 nm which is a first layer 35a as the reflective electrode 35.

The reflective electrode 35 is electrically connected to the drain of the transistor 124 which is described above via a first contact electrode 28 (refer to FIGS. 3 and 5A) which is disposed so as to pass through the interlayer insulation layer 34. In addition, the reflective electrode 35 is electrically connected to one of the source or the drain (not shown in the drawings) of the transistor 125 via the first contact electrode 28. For the first contact electrode 28, for example, it is possible to use a conductive material such as tungsten (W), titanium (Ti), or titanium nitride (TiN). In the embodiment, the first layer 35a of the reflective electrode 35 is connected to the first contact electrode 28.

The reflection enhancing layer 36 is for increasing reflectivity using the reflective electrode 35, and if made from, for example, an insulation layer which has light permeability. The reflection enhancing layer 36 is disposed so as to cover the surface of the reflective electrode 35. In the embodiment, a silicon oxide ($SiO_2$) film with, for example, a film thickness of 40 nm is formed as the reflection enhancing layer 36.

The protective layer 37 is provided so as to cover the surface of the reflective electrode 35 in which the gap 35CT is formed. The protective layer 37 has a first insulation film 39, and an embedded insulation film 40. The first insulation film 39 is provided on the surface of the reflection enhancing layer 36, the reflective electrode 35, and the interlayer insulation layer 34, and is formed along the gap 35CT. Accordingly, the first insulation film 39 has the concave section 39a which corresponds to the gap 35CT. The embedded insulation film 40 is formed so as to be embedded in the concave section 39a. In the protective layer 37, the surface on a side which comes into contact with the optical path adjustment layer 38 is flattened by the embedded insulation film which is embedded in the concave section 37a. In the embodiment, a silicon nitride (SiN) film with, for example, a film thickness of 80 nm is formed as the first insulation film 39, and a silicon oxide ($SiO_2$) film is formed as the embedded insulation film 40.

The optical path adjustment layer 38 has insulation films 38a and 38b which are disposed on the surface of the protective layer 37. The optical path adjustment layer 38 performs optical path adjustment in each pixel 20B, 20G, and 20R according to the optical distance between the reflective electrode 35 and the counter electrode 33.

In detail, the film thickness of the optical path adjustment layer 38 becomes larger in order of the pixel 20B, the pixel 20G, and the pixel 20R. That is, as shown in FIG. 6A, in the pixel 20B, the insulation films 38a and 38b are omitted such that, for example, the resonant wavelength (peak wavelength where luminance is maximum) is 470 nm. As shown in FIG. 6B, in the pixel 20G, the insulation film 38a is provided, for example, such that the resonant wavelength is 540 nm. As shown in FIG. 6C, in the pixel 20R, the insulation films 38a and 38b are provided, for example, such that the resonant wavelength is 610 nm. In the embodiment, a silicon oxide ($SiO_2$) film with, for example, a film thickness of 40 nm is formed as the insulation film 38a, and a silicon oxide ($SiO_2$) film with, for example, a film thickness of 50 nm is formed as the insulation film 38b. In addition, the reflection enhancing layer 36 and the protective layer 37 perform optical path adjustment according to the optical distance between the reflective electrode 35 and the counter electrode 33, for example, in the pixel 20B, the film thickness of the reflection enhancing layer 36 and the protective layer 37, for example, the resonant wavelength (peak wavelength where luminance is maximum) is 470 nm.

Thereby, blue (B) light is emitted from the pixel 20B with a peak wavelength of 470 nm, green (G) light is emitted from the pixel 20G with a peak wavelength of 540 nm, and red (R) light is emitted from the pixel 20R with a peak wavelength of 610 nm. In the organic EL apparatus 100, color purity of display light which is emitted from each pixel 20 is increased using the organic EL element 30 which has such a resonant structure.

The optical path adjustment layer 38 is provided among each of the organic EL elements 30B, 30G, and 30R. In detail, the optical path adjustment layer 38 is configured from the same type of material as the embedded insulation film 40, the optical path adjustment layer 38 is provided so as to cover the embedded insulation film 40. According to such a configuration, the optical path adjustment layer 38 is processable according to the resonant wavelength without impairing the flatness of the surface on the pixel electrode 31 side of the protective layer 37. In the embodiment, the optical path adjustment layer 38 and the embedded insulation film 40 are configured using silicon oxide ($SiO_2$).

As shown in FIGS. 5A, 5B, and 6A to 6C, the pixel electrode 31 is disposed on the optical path adjustment layer 38. The pixel electrode 31 is electrically connected to the reflective electrode 35 via a second contact electrode 41. In detail, a contact hole 41CT is provided such that the protective layer 37 and the reflection enhancing layer 36 pass therethrough. The contact hole 41CT is positioned below a region which does not overlap with the opening 29CT in planar view, that is, a region in which the pixel separation layer 29 is formed.

The second contact electrode 41 has a first contact section 41a and a second contact section 41b. The first contact section 41a is disposed within the contact hole 41CT, and is connected to the second layer 35b of the reflective electrode 35. The second contact section 41b is disposed on the surface of the protective layer 37, and is connected to the pixel electrode 31. In the embodiment, for example, a titanium nitride (TiN) film is formed as the second contact electrode 41, and the thickness of the second contact section 41b is formed so as to be 50 nm.

As shown in FIGS. 5A, 5B, and 6A to 6C, a portion of the optical path adjustment layer 38 is formed so as to overlap with the second contact electrode 41. According to this configuration, it is possible to dispose the second contact electrode 41 in the vicinity of the region among each of the organic EL elements 30B, 30G, and 30R without impairing the flatness of the surface on the pixel electrode 31 side of the protective layer 37. Thereby, it is possible to reduce the size of a region that does not contribute to light emission, and it is possible to increase the aperture ratio of each pixel 20.

As shown in FIG. 6A, in the pixel 20B, the insulation films 38a and 38b which configure the optical path adjustment layer 38 are provided in a region which overlaps with a portion of the second contact electrode 41, or the embedded insulation film 40. The insulation films 38a and 38b which configure the optical path adjustment layer 38 are not provided on the surface of a portion of the second contact electrode 41, and therein a conductive material which configures the pixel electrode 31 is laminated on the second contact electrode 41, and the conductive material which configures the pixel electrode 31 comes into contact with the second contact electrode 41.

As shown in FIG. 6B, in the pixel 20G, the insulation film 38a which configures the optical path adjustment layer 38 is provided in a region which overlaps with a portion of the second contact electrode 41, or the embedded insulation film 40. Then, the contact hole is provided in the insulation film 38b, the conductive material which configures the pixel electrode 31 is disposed inside the contact hole, and the pixel electrode 31 is connected to the second contact electrode 41. In the pixel 20G, the insulation film 38b which configures the optical path adjustment layer 38 is provided substantially on the entire surface except for the contact hole. In more detail, the insulation film 38a which configures the optical path adjustment layer 38 is provided in a region which overlaps with a portion of the second contact electrode 41, the reflective electrode 35, or the embedded insulation film 40.

As shown in FIG. 6C, in the pixel 20R, the insulation films 38a and 38b which configure the optical path adjustment layer 38 are provided in a region which overlaps with a portion of the second contact electrode 41, the reflective electrode 35, or the embedded insulation film 40. Then, the contact hole is provided in the insulation films 38a and 38b, the conductive material which configures the pixel electrode 31 is disposed within the contact hole, and the pixel electrode 31 is connected to the second contact electrode 41.

Here, although omitted from the drawings, the light-emitting function layer 32 and the counter electrode 33 which are described above are disposed on the pixel electrode 31, and furthermore on top, cover the surface of the element substrate 10, and suppress infiltration of moisture, oxygen, and the like in the organic EL element 30 using a sealing layer (passivation film) 49, which flattens the surface of the organic EL element 30, being disposed. The color filter layer 50 which is described above is disposed on the surface of the sealing layer 49.

Here, the organic EL apparatus 100 of the embodiment is configured such that the transistor 124 and the reflective electrode 35 are electrically connected via the first contact electrode 28 which is described above, and the reflective electrode 35 and the pixel electrode 31 are electrically connected via the second contact electrode 41. That is, the pixel electrode 31 is electrically connected to the transistor 124 via the reflective electrode 35. In a case where the resistance and contact resistance of the first contact electrode 28, the reflective electrode 35, the second contact electrode 41, and the pixel electrode 31 are ignored, these members effectively have the same potential.

Thereby, in the organic EL apparatus 100 of the embodiment, in a case where the power supply line (reflective electrode) and the first electrode (pixel electrode) in the related art which is described above are shorted, it is possible to achieve a further improvement in yield since it is possible to avoid a problem of the potential of the power supply line being applied to the first electrode without change.

That is, in the organic EL apparatus 100 of the embodiment, a case where a portion of such a power supply line of the related art configures the reflective electrode, and a case where the power supply line and the reflective electrode are electrically connected are different, and the reflective electrode 35 and the pixel electrode 31 have the same potential due to the reflective electrode 35 and the pixel electrode 31 being electrically connected. Thereby, it is possible to avoid a short between the power supply line and the pixel electrode, which is generated by a defect or the like in the insulation layer between the reflective electrode 35 and the pixel electrode 31 (the reflection enhancing layer 36, the protective layer 37, the optical path adjustment layer 38, and the like).

In addition, in the organic EL apparatus 100 of the embodiment, using such a configuration, it is possible to perform the light-emitting operation of the organic EL element 30 with high reliability while controlling the potential which is applied from the transistor 124 to the pixel electrode 31 via the reflective electrode 35.

In addition, in the organic EL apparatus 100 of the embodiment, it is possible to perform the light-emitting operation of the organic EL element 30 with good color reproducibility due to the resonant structure which is described above since it is possible to easily perform optical path adjustment between the reflective electrode 35 and the pixel electrode 31 using the optical path adjustment layer 38 while protecting the reflective electrode 35 using the protective layer 37 which is described above.

Furthermore, in the organic EL apparatus 100 of the embodiment, since the surface of the protective layer 37 which is described above on the side which comes in contact with the optical path adjustment layer 38 is flattened, it is possible to accurately perform optical path adjustment between the reflective electrode 35 and the pixel electrode 31 using the optical path adjustment layer 38 in each pixel 20. Thereby, it is possible to perform the light-emitting operation for the organic EL element 30 with good color reproducibility using the resonant structure which is described above.

In addition, in the organic EL apparatus 100 of the embodiment, it is possible to protect the embedded insulation film 40 when patterning is carried out on the optical path adjustment layer 38 in a predetermined shape by the optical path adjustment layer 38 which is described above covering the surface of the embedded insulation film 40.

Here, the same type of material is used in the optical path adjustment layer 38 (insulation films 38a and 38b) and the embedded insulation film 48, and different materials from the optical path adjustment layer 38 and the embedded insulation film 48 are used in the first insulation film 39. In the embodiment, silicon oxide ($SiO_2$) is used in the optical path adjustment layer 38 (insulation films 38a and 38b) and the embedded insulation film 48, and silicon nitride (SiN) with an etching rate lower than the silicon oxide ($SiO_2$) is used in the first insulation film 39.

In this case, it is possible to selectively etch silicon oxide with respect to silicon nitride by, for example, dry etching using fluorine-based gas. Then, an end section of a portion of at least one of the optical path adjustment layer 38 (insulation films 38a and 38b) is disposed so as to be positioned on the surface of the first insulation film 39. Thereby, it is possible for the first insulation film 39 to function as an etching stopper for the optical path adjustment layer 38.

In addition, in the organic EL apparatus 100 of the embodiment, the contact electrode 41 which is described above has the first contact section 41a which is connected to the reflective electrode 35 in a state of being embedded in the contact hole 41CT, and the second contact section 41b which is connected to the pixel electrode 31 in a state of covering the surface of the optical path adjustment layer 38. In this case, it is possible to effectively connect the reflective electrode 35 and the pixel electrode 31 via the second contact electrode 41.

Furthermore, in the organic EL apparatus 100 of the embodiment, the second contact section 41b functions as an etching stopper for the optical path adjustment layer 38, and it is possible to increase the aperture ratio of each pixel 20 when patterning is carried out on the optical path adjustment layer 38 in a predetermined shape by an end section of at least a portion of the optical path adjustment layer 38 which is described above being positioned on the surface of the second contact section 41b.

Second Embodiment

Organic EL Apparatus

Next, an organic EL apparatus 100A which is illustrated in FIGS. 7A to 8C as a second embodiment of the invention will be described. Here, in the description below, the parts which are the same as the organic EL apparatus 100 described above will be omitted from the description and given the same reference numerals in the drawings.

Figure 8A:
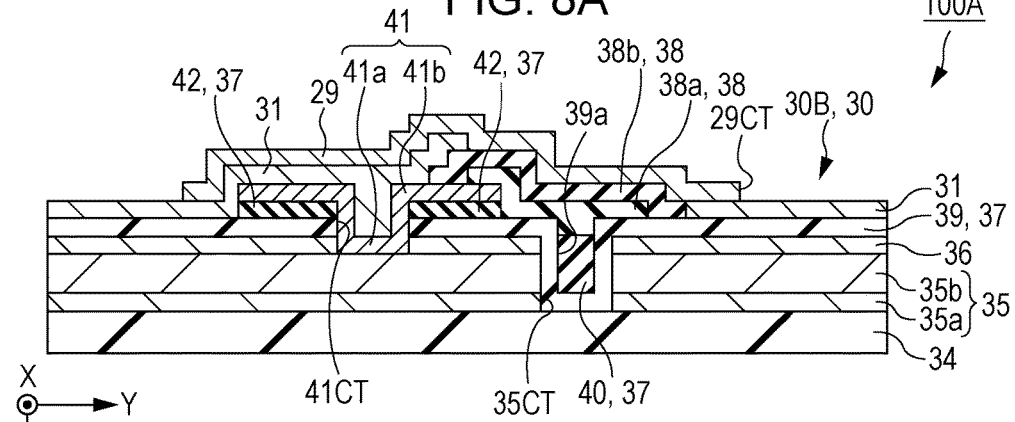
FIG. 8A is a sectional view according to the second embodiment using the line segment VIIIA-VIIIA which is illustrated in FIG. 4.
Figure 8B:
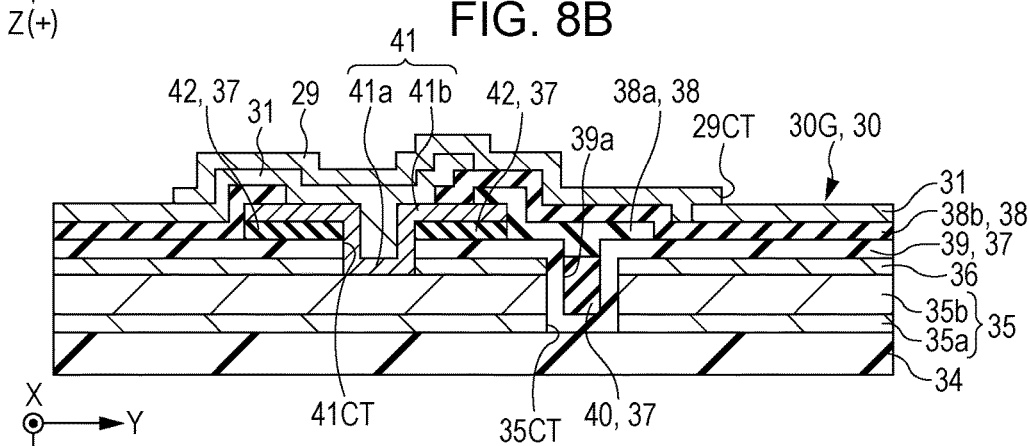
FIG. 8B is a sectional view according to the second embodiment using the line segment VIIIB-VIIIB which is illustrated in FIG. 4.
Figure 8C:
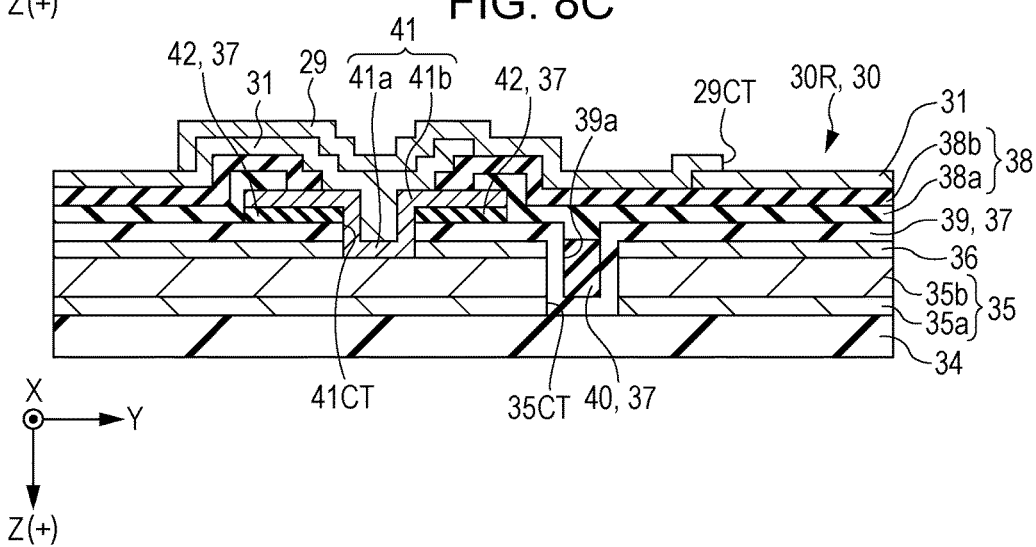
FIG. 8C is a sectional view according to the second embodiment using the line segment VIIIC-VIIIC which is illustrated in FIG. 4.

FIG. 7A is a sectional view along the X direction of the pixels 20B, 20G, and 20R using a line segment VIIA-VIIA which is illustrated in FIG. 4. FIG. 7B is an enlarged sectional view of a portion of the pixel 20R which is illustrated in FIG. 7A. FIG. 8A is a sectional view along the Y direction of the pixel 20B using a line segment VIIIA-VIIIA which is illustrated in FIG. 4. FIG. 8B is a sectional view along the Y direction of the pixel 20G using a line segment VIIIB-VIIIB which is illustrated in FIG. 4. FIG. 8C is a sectional view along the Y direction of the pixel 20R using a line segment VIIIC-VIIIC which is illustrated in FIG. 4.

As shown in FIGS. 7A, 7B, and 8A to 8C, an organic EL apparatus 100A according to the second embodiment is different from the organic EL apparatus 100 according to the embodiment described above in the point of being provided with a second insulation film 42.

As shown in FIGS. 4, 7A, and 7B, each of the pixels 20B, 20G, and 20R are disposed such that a short direction is parallel to the X direction (a long direction is parallel to the Y direction) in order to respectively take a rectangular shape in planar view. In addition, the pixel separation layer 29 is provided among each of the organic EL elements 30B, 30G, and 30R.

The protective layer 37 is provided so as to cover the surface of the reflective electrode 35 on which the gap 35CT is formed. In addition to the first insulation film 39 and the embedded insulation film 40, the protective layer 37 is provided with the second insulation film 42. The second insulation film 42 is provided between the second contact section 41b and the first insulation film 39.

The first insulation film 39 is provided on the surface of the reflection enhancing layer 36, the reflective electrode 35, and the interlayer insulation layer 34, and is formed along the gap 35CT. Accordingly, the first insulation film 39 has the concave section 39a which corresponds to the gap 35CT. The embedded insulation film 40 is formed so as to be embedded in the concave section 39a.

In addition, the second insulation film 42 is patterned in the same shape as the second contact section 41b. That is, the second insulation film 42 is disposed between the first insulation film 39 and the second contact section 41b, and has a shape which matches the second contact section 41b in planar view.

In the embodiment, a silicon nitride (SiN) film with, for example, a film thickness of 80 nm is formed as the first insulation film 39, a silicon oxide ($SiO_2$) film is formed as the embedded insulation film 40, and a silicon oxide ($SiO_2$) film with, for example, a film thickness of 50 nm is formed as the second insulation film 42.

Here, although omitted from the drawings, in the same manner as the first embodiment, the light-emitting function layer 32 and the counter electrode 33 which are described above are disposed on the pixel electrode 31, and furthermore on top, cover the surface of the element substrate 10, and suppress infiltration of moisture, oxygen, and the like in the organic EL element 30 by disposing a sealing layer (passivation film) 49, which flattens the surface of the organic EL element 30. The color filter layer 50 which is described above is disposed on the surface of the sealing layer 49.

Here, in the organic EL apparatus 100A of the embodiment, it is possible for the first insulation film 39 to function as an etching stopper for the second insulation film 42 when patterning is carried out on the second contact electrode 41 which is described above in a predetermined shape. Thereby, even in a case where patterning is carried out on the second insulation film 42 with the same shape as the second contact section 41b, it is possible to prevent generation of variation in the thickness of the first insulation film 39 which is below the second insulation film 42.

Organic EL Apparatus Manufacturing Method

In detail, a manufacturing method of the organic EL apparatus 100A of the second embodiment will be described with reference to FIGS. 9A to 9D. Here, FIGS. 9A to 9D are sectional views for describing a manufacturing process of the protective layer 37 and the second contact electrode 41 with respect to the configuration of the organic EL apparatus 100A described above.

Figure 9A:
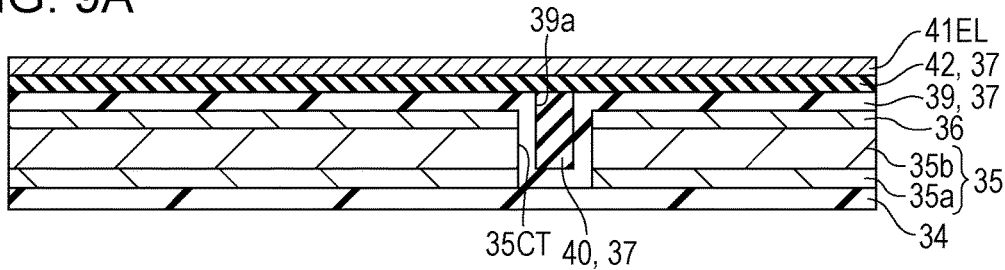
FIGS. 9A to 9D are sectional views for describing a manufacturing process for an organic EL apparatus according to the second embodiment.

As shown in FIG. 9A, in the embodiment, first, the first insulation film 39 which covers the surface of the reflection enhancing layer 36 is formed as the protective layer 37 on the reflective electrode 35, the embedded insulation film 40 is formed which is embedded in the concave section 39a, then the second insulation film 42 is formed which covers the surface of the first insulation film 39 that is flattened by the embedded insulation film 40. Here, in the embodiment, as described above, a silicon nitride (SiN) film with, for example, a film thickness of 80 nm is formed as the first insulation film 39, a silicon oxide (SiO$_2$) film is formed as the embedded insulation film 40, and a silicon oxide (SiO$_2$) film with, for example, a film thickness of 50 nm is formed as the second insulation film 42.

Figure 9B:
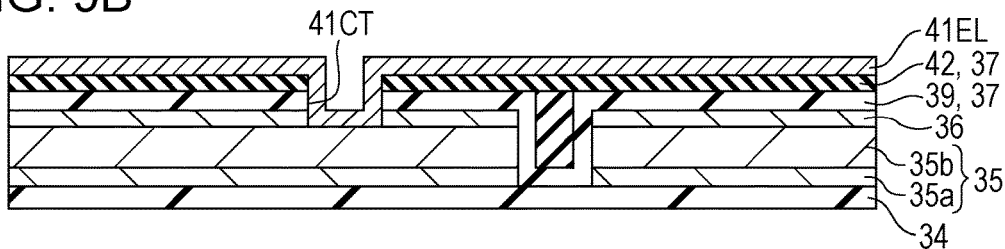

Next, as shown in FIG. 9B, the contact hole 41CT is formed which the reflection enhancing layer 36, the first insulation film 39, and the second insulation film 42 pass through, then a conductive film 41EL is formed which covers the surface of the second insulation film 42 in a state of being embedded in the contact hole 41CT. Here, in the embodiment, as described above, a titanium nitride (TiN) layer with a thickness of 50 nm is formed as the conductive film 41EL.

Figure 9C:
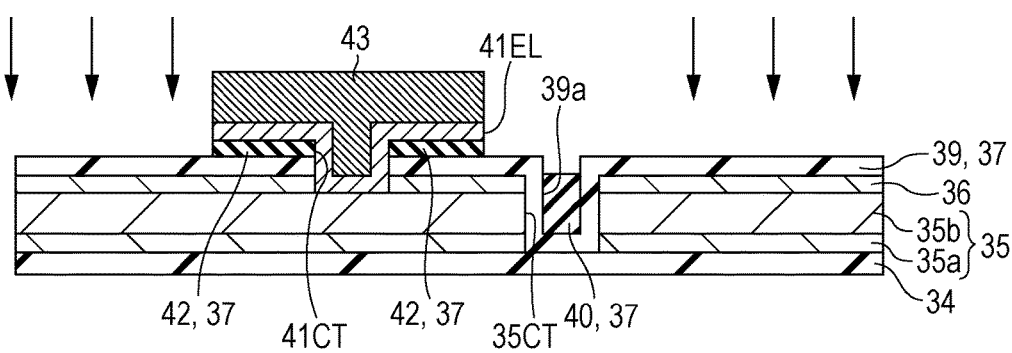

Next, as shown in FIG. 9C, a resist is coated on the surface of the conductive film 41EL, then a mask layer 43 is formed in a shape which corresponds to the second contact section 41b using a photolithography technique. After that, the conductive film 41EL and the second insulation film 42 are etched until the surface of the first insulation film 39 is exposed.

At this time, it is possible to selectively carry out etching on the second insulation film (silicon oxide film) 42 which has a lower etching rate than the first insulation film 39 with respect to the first insulation film (silicon nitride film) 39 by dry etching using fluorine-based gas. Accordingly, in the embodiment, it is possible for the first insulation film 39 to function as an etching stopper for the second insulation film 42 by increasing the etching selection ratio of the first insulation film 39 and the second insulation film 42 (the etching rate of the second insulation film 42/the etching rate of the first insulation film 39).

Figure 9D:
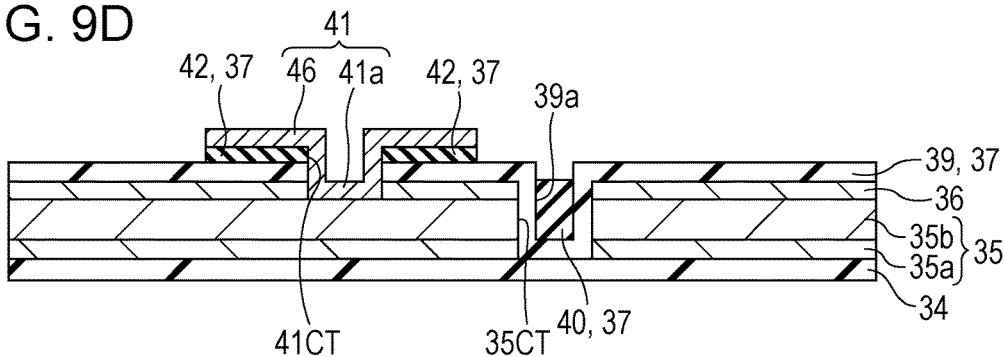

Next, as shown in FIG. 9D, the mask layer 43 is removed. Thereby, the second contact electrode 41 is formed which has the first contact section 41a which is connected to the reflective electrode 35 in a state of being embedded in the contact hole 41CT, and the second contact section 41b which is connected to the pixel electrode 31 in a state of being disposed on the surface of the second insulation film 42.

As described above, in the organic EL apparatus 100 of the second embodiment, even in a case where patterning is carried out on the second insulation film 42 which is described above with the same shape as the second contact section 41b, it is possible to prevent generation of variation in the thickness of the first insulation film 39 which is below the second insulation film 42. Accordingly, in the organic EL apparatus 100A, it is possible to perform the light-emitting operation of the organic EL element 30 with good color reproducibility due to the resonant structure since it is possible to easily perform optical path adjustment between the reflective electrode 35 and the pixel electrode 31 by adjusting the thickness of the optical path adjustment layer 38 which is disposed on the surface of the protective layer 37.

Third Embodiment

Organic EL Apparatus

Next, an organic EL apparatus 100B which is illustrated in FIGS. 10 and 11 will be described as a third embodiment of the invention. Here, in the description below, the parts which are the same as the organic EL apparatuses 100 and 100A described above will be omitted from the description and given the same reference numerals in the drawings.

Figure 10A:
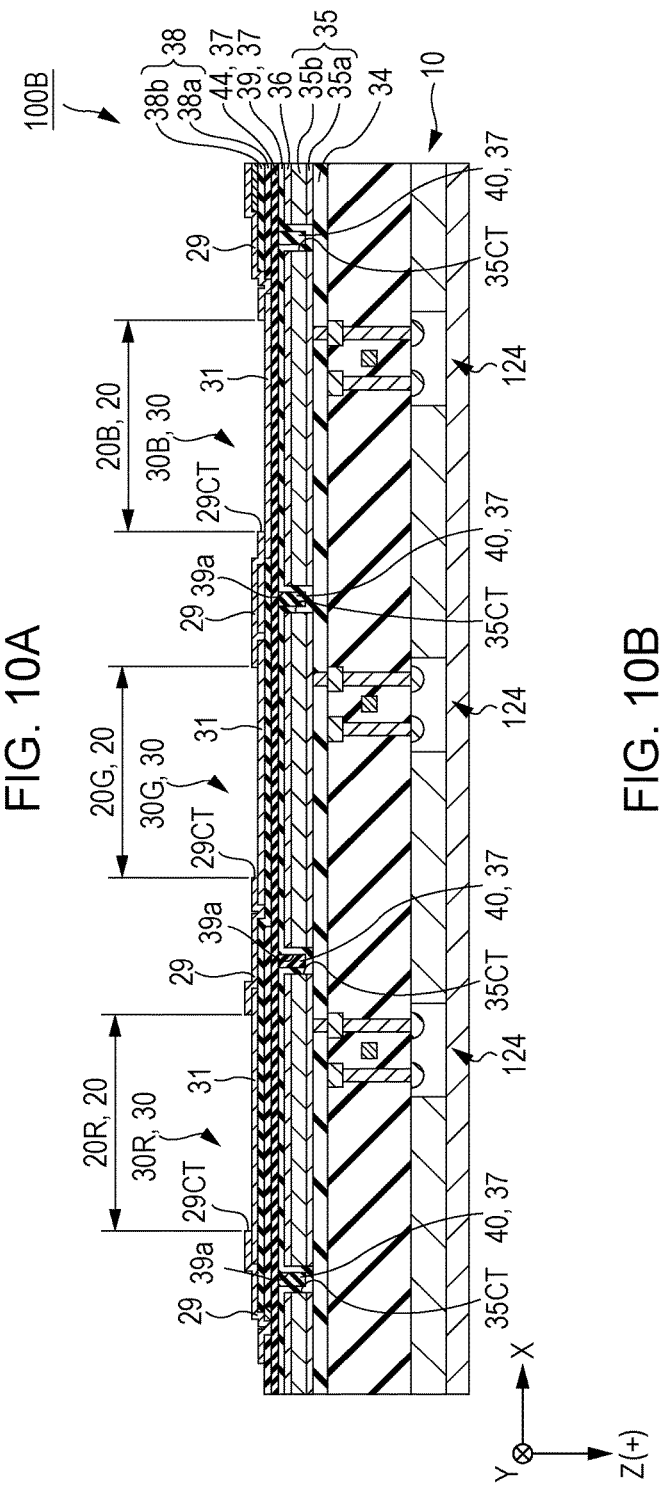
FIG. 10A is a sectional view according to a third embodiment using the line segment XA-XA which is illustrated in FIG. 4.
Figure 10B:
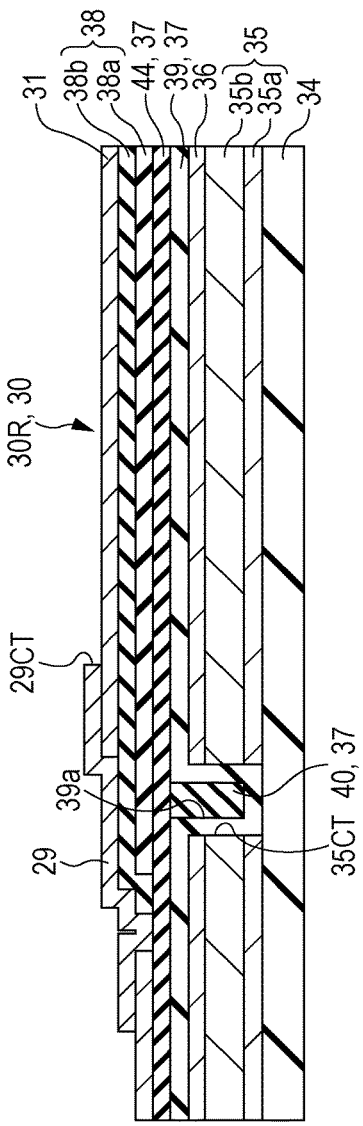
FIG. 10B is an enlarged sectional view of a portion of the pixel which is illustrated in FIG. 10A.

FIG. 10A is a sectional view along the X direction of the pixels 20B, 20G, and 20R using a line segment XA-XA which is illustrated in FIG. 4. FIG. 10B is an enlarged sectional view of a portion of the pixel 20R which is illustrated in FIG. 10A. FIG. 11A is a sectional view along the Y direction of the pixel 20B using a line segment XIA-XIA which is illustrated in FIG. 4. FIG. 11B is a sectional view along the Y direction of the pixel 20G using a line segment XIB-XIB which is illustrated in FIG. 4. FIG. 11C is a sectional view along the Y direction of the pixel 20R using a line segment XIC-XIC which is illustrated in FIG. 4.

As shown in FIGS. 10A, 10B, and 11A to 11C, an organic EL apparatus 100B according to the third embodiment is different from the organic EL apparatus 100A according to the second embodiment described above in the point of being provided with a third insulation film 44. In addition, the disposition of the optical path adjustment layer 38 is different from in the organic EL apparatus 100 according to the first embodiment, and the organic EL apparatus 100A according to the second embodiment.

As shown in FIGS. 4, 10A, and 10B, each of the pixels 20B, 20G, and 20R are disposed such that a short direction is parallel to the X direction (a long direction is parallel to the Y direction) in order to respectively take a rectangular shape in planar view. In addition, the pixel separation layer 29 is provided among each of the organic EL elements 30B, 30G, and 30R.

The protective layer 37 is provided so as to cover the surface of the reflective electrode 35 on which the gap 35CT is formed. The protective layer 37 is provided with the first insulation film 39, the embedded insulation film 40, the second insulation film 42, and the third insulation film 44.

The first insulation film 39 is provided on the surface of the reflection enhancing layer 36, the reflective electrode 35, and the interlayer insulation layer 34, and is formed along the gap 35CT. Accordingly, the first insulation film 39 has the concave section 39a which corresponds to the gap 35CT. The embedded insulation film 40 is formed so as to be embedded in the concave section 39a.

In addition, the second insulation film 42 is provided between the second contact section 41b and the third insulation film 44, and is patterned in the same shape as the second contact section 41b. That is, the second insulation film 42 is disposed between the first insulation film 39 and the second contact section 41b, and has a shape which matches the second contact section 41b in planar view.

The third insulation film 44 is formed so as to cover the surface which is flattened by the embedded insulation film 40 of the first insulation film 39. In the protective layer 37, the surface on a side which comes into contact with the optical path adjustment layer 38 is flattened by the third insulation film 44. In the embodiment, a silicon nitride (SiN) film with, for example, a film thickness of 80 nm is formed as the first insulation film 39, a silicon oxide (SiO$_2$) film is formed as the embedded insulation film 40, a silicon oxide (SiO$_2$) film with, for example, a film thickness of 50 nm is formed as the second insulation film 42, and a silicon nitride (SiN) film with, for example, a film thickness of 80 nm is formed as the third insulation film 44.

The end section of the optical path adjustment layer 38 (insulating films 38*a* and 38*b*) is positioned on the embedded insulation film 40. The third insulation film 44 is provided between the end section of the optical path adjustment layer 38 and the embedded insulation film 40. The embedded insulation film 40 and the optical path adjustment layer 38 are configured by the same type of material, and are configured of a material which is different from the third insulation film 44. In the embodiment, the embedded insulation film 40 and the optical path adjustment layer 38 are silicon oxide (SiO$_2$), and the second insulation film 42 is a silicon nitride (SiN) film. Accordingly, it is possible to form the optical path adjustment layer 38 with film thicknesses which are different for each pixel 20 without impairing smoothness of the surface of the protective layer 37.

In the pixel 20B the reflection enhancing layer 36, the first insulation film 39, and the third insulation film 44 are provided between the reflective electrode 35 and the pixel electrode 31 such that, for example, the resonant wavelength (peak wavelength where luminance is maximum) is 470 nm. In the pixel 20G, the reflection enhancing layer 36, the first insulation film 39, the third insulation film 44, and the insulation film 38*a* are provided between the reflective electrode 35 and the pixel electrode 31 such that, for example, the resonant wavelength is 540 nm. In the pixel 20R, the reflection enhancing layer 36, the first insulation film 39, the third insulation film 44, the insulation film 38*a*, and the insulation film 38*b* are provided between the reflective electrode 35 and the pixel electrode 31 such that, for example, the resonant wavelength is 610 nm.

Then, the end sections of the optical path adjustment layer 38 (insulation films 38*a* and 38*b*) are positioned between the pixel 20R and the pixel 20G, between the pixel 20G and the pixel 20B, and between the pixel 20B and the pixel 20R. In the embodiment, as in FIG. 1, the end sections of the optical path adjustment layer 38 are provided in a stripe form which extends in the Y direction since the pixels 20 are disposed using a stripe method. As shown in FIGS. 10A and 10B, the end sections of the optical path adjustment layer 38 are positioned above the embedded insulation film 40 in the gap 35CT of the adjacent reflective electrode 35 in the X direction.

As shown in FIGS. 10A and 11A, in the pixel 20B, the insulation films 38*a* and 38*b* which configure the optical path adjustment layer 38 are not disposed across substantially the entire surface. Accordingly, the conductive material which configures the pixel electrode 31 is disposed on the surface of the second contact electrode 41, and the conductive material which configures the pixel electrode 31 comes into contact with the second contact electrode 41.

In this manner, the insulation film which configures the pixel electrode 31 is formed on the second contact electrode 41 and on the third insulation film 44. A portion of the pixel separation layer 29 is laminated on the third insulation film 44. In FIGS. 6A and 8A, the insulation films 38*a* and 38*b* are provided between the adjacent pixels B, but as shown in FIG. 10A, in the embodiment, the optical path adjustment layer 38 is not necessary between the adjacent pixels B. Accordingly, in the organic EL apparatus 100B of the third embodiment, it is possible to form the light-emitting function layer 32, the counter electrode 33, the color filter layer 50B, and the like on a flatter surface.

As shown in FIGS. 10A and 11B, in the pixel 20G, the insulation film 38*a* which configures the optical path adjustment layer 38 is not disposed across substantially the entire surface. Then, the contact hole is provided in the insulation film 38*b*, the conductive material which configures the pixel electrode 31 is disposed inside the contact hole, and the pixel electrode 31 is connected to the second contact electrode 41.

In the pixel 20G, the insulation film 38*b* which configures the optical path adjustment layer 38 is provided substantially on the entire surface except for the contact hole. In more detail, the insulation film 38*b* which configures the optical path adjustment layer 38 is provided so as to overlap with a portion of the second contact electrode 41, and is formed on the third insulation film 44 above the reflective electrode 35 and the embedded insulation film 40. In FIGS. 6B and 8B, the insulation film 38*a* is not provided between adjacent pixels G, but as shown in FIG. 10A, in the embodiment, the insulation film 38*a* is not necessary between the adjacent pixels G. Accordingly, in the organic EL apparatus 100B of the third embodiment, it is possible to form the light-emitting function layer 32, the counter electrode 33, the color filter layer 50G, and the like on a flatter surface.

As shown in FIGS. 10A, 10B, and 11C, in the pixel 20R, the contact hole is provided in the insulation films 38*a* and 38*b*, the conductive material which configures the pixel electrode 31 is disposed within the contact hole, and the pixel electrode 31 is connected to the second contact electrode 41. In the pixel 20R, the insulation films 38*a* and 38*b* which configure the optical path adjustment layer 38 are provided substantially on the entire surface except for the contact hole. In more detail, the insulation films 38*a* and 38*b* which configure the optical path adjustment layer 38 are provided so as to overlap with a portion of the second contact electrode 41, and are laminated on the third insulation film 44 above the reflective electrode 35 and the embedded insulation film 40.

Here, although omitted from the drawings, the light-emitting function layer 32 and the counter electrode 33 which are described above are disposed on the pixel electrode 31, and furthermore on top, cover the upper surface of the element substrate 10, and suppress infiltration of moisture, oxygen, and the like in the organic EL element 30 by disposing a sealing layer (passivation film) 49, which flattens the surface of the organic EL element 30. The color filter layer 50 which is described above is disposed on the surface of the sealing layer 49.

Here, in the organic EL apparatus 100B of the third embodiment, since the surface of the protective layer 37 which is described above on the side which comes in contact with the optical path adjustment layer 38 is flattened, it is possible to accurately perform optical path adjustment between the reflective electrode 35 and the pixel electrode 31 by adjusting the thickness of the optical path adjustment layer 38 in each pixel 20. Thereby, it is possible to perform the light-emitting operation for the organic EL element 30 with good color reproducibility using the resonant structure which is described above.

In addition, in the organic EL apparatus 100B of the third embodiment, the end section of the pixel electrode 31 which is disposed on the surface of the optical path adjustment layer 38 is disposable close to the concave section 39a since the optical path adjustment layer 38, which is disposed on the surface of the protective layer 37 which is described above, is also flattened. Thereby, it is possible to increase the aperture ratio of the pixels 20, that is, the aperture area (light-emitting area) of the opening 29CT which specifies the light-emitting area of the pixels 20 which is described above.

In addition, in the organic EL apparatus 100B of the third embodiment, an end section of a portion of at least one of the optical path adjustment layer 38 (insulation films 38a and 38b) is disposed so as to be positioned on the surface of the third insulation film 44 which is described above. Meanwhile, silicon oxide ($SiO_2$) is used in the optical path adjustment layer 38 (insulation films 38a and 38b) and the embedded insulation film 48, and a silicon nitride (SiN) film with an etching rate lower than the silicon oxide ($SiO_2$) is used in the second insulation film 42.

In this case, it is possible to selectively etch silicon oxide with respect to silicon nitride by, for example, dry etching using fluorine-based gas. Accordingly, it is possible for the second insulation film 42 to function as an etching stopper for the optical path adjustment layer 38 while protecting the embedded insulation film 40 when patterning is carried out on the optical path adjustment layer 38 in a predetermined shape.

In the embodiment described above, as shown in FIGS. 5A and 5B, or 7A and 7B, the optical path adjustment layer 38 reaches from a region which overlaps with the reflective electrode 35 of the organic EL element 30R to a region which overlaps with the embedded insulation film 40 or the gap 35CT of the reflective electrode 35, and furthermore, a region which overlaps with the reflective electrode 35 of the adjacent organic EL element 30B. In contrast to this, as shown in FIGS. 10A and 10B, since the organic EL apparatus 100B of the third embodiment has the third insulation film 44, the optical path adjustment layer 38 is disposable so as to reach from the region which overlaps with the reflective electrode 35 of the organic EL element 30R to the region which overlaps with a portion of the embedded insulation film 40 without overlapping with the reflective electrode 35 of the adjacent organic EL element 30B. Consequently, the region which overlaps with the optical path adjustment layer 38 and the reflective electrode 35 of the organic EL element 30B is not necessary. Here, between the pixel 20B and the pixel 20R is described, but between the pixel 20R and the pixel 20G, and between the pixel 20G and the pixel 20B are also the same. Accordingly, it is possible to reduce the size of a region that does not contribute to light emission, and it is possible to increase the aperture ratio of each pixel 20.

Electronic Device

Figure 12:
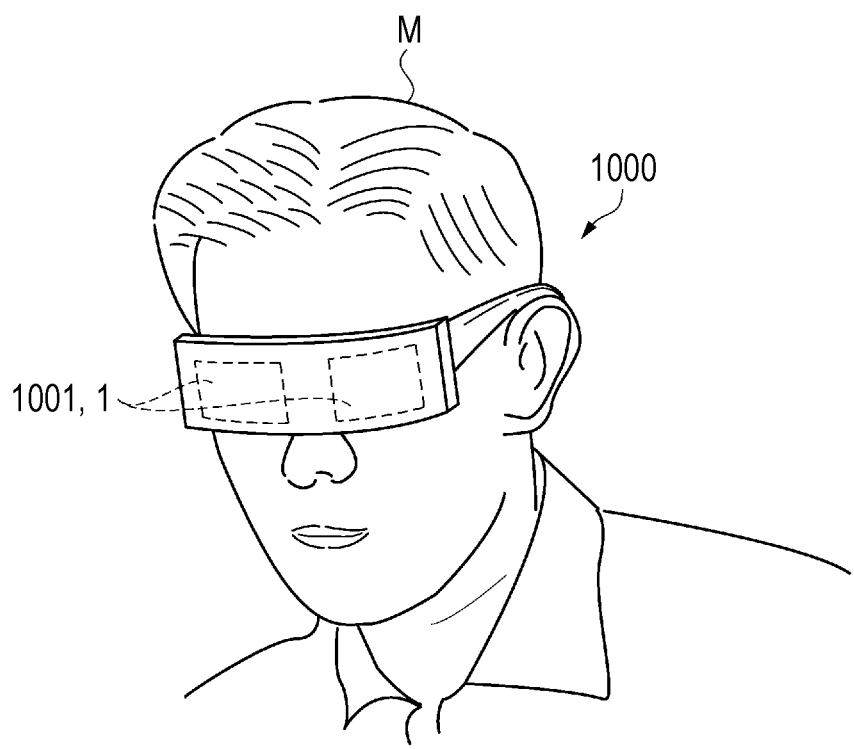
FIG. 12 is a schematic view illustrating an example of an electronic device which is provided with the organic EL apparatus that is illustrated in FIG. 1.

FIG. 12 is a schematic view illustrating a head-mounted display 1000 as an example of an electronic device which is provided with the organic EL apparatus 100.

As shown in FIG. 12, the head-mounted display 1000 has two display sections 1001 which are provided to correspond to left and right eyes. An observer M is able to see characters, images, and the like which are displayed on the display sections 1001 by mounting the head-mounted display 1000 on their head as glasses. For example, if an image is displayed taking a parallax in the left and right display sections 1001, it is also possible to enjoy viewing three-dimensional moving images.

The organic EL apparatus 100 is used in the display sections 1001. In the organic EL apparatus 100, it is possible to increase operation reliability of the organic EL element 30 described above, and it is possible to achieve a further improvement in yield. Accordingly, it is possible to suppress generation of point defects and provide the head-mounted display 1000 with a high-quality display by mounting the organic EL apparatus 100 in the display sections 1001.

Here, the invention is not necessarily limited to the embodiments described above, and it is possible to add various modifications without deviating from the gist of the invention.

In detail, the electro-optical apparatus to which the invention is applied is not limited to the organic EL apparatus which is provided with the organic EL element as the light-emitting element which is described above, and it is possible to widely apply the invention to, for example, an electro-optical apparatus which is provided with a self-luminous light-emitting element such as an inorganic EL element or an LED.

In addition, the electronic device to which the present invention is applied is not limited to the head-mounted display which is described above, and it is possible, for example, to give the example of an electronic device which uses the electro-optical apparatus to which the invention is applied in a head-up display, an electronic viewfinder of a digital camera, a portable information terminal, and a display section such as a navigator.

The entire disclosure of Japanese Patent Application No. 2014-262962, filed Dec. 25, 2014 is expressly incorporated by reference herein.

What is claimed is:

1. An electro-optical apparatus comprising:
    an element substrate that includes a display region in which a plurality of pixels are arranged in a matrix form,
    wherein the element substrate has a light-emitting element and a transistor which drives the light-emitting element in each pixel,
    wherein the light-emitting element is disposed via an insulation layer above the transistor, and has a structure in which a reflective electrode, a protective layer, an optical path adjustment layer, a first electrode, a light-emitting layer, and a second electrode are laminated,
    wherein the reflective electrode is disposed by being split in each pixel,
    wherein a gap is formed between each reflective electrode that is disposed by being split in each pixel,
    wherein the protective layer covers the surface on which the reflective electrode is disposed, and includes an embedded insulation film which is embedded in the gap, and
    wherein a reflection enhancing layer is disposed on the surface of the reflective electrode so as to directly contact the surface of the reflective electrode.

2. The electro-optical apparatus according to claim 1, wherein the transistor and the reflective electrode are electrically connected via a first contact electrode which is disposed so as to pass through the insulation layer, and
    the reflective electrode and the first electrode are electrically connected via a second contact electrode which is disposed so as to pass through the protective layer.

3. The electro-optical apparatus according to claim 2, the protective layer further comprising:
    a first insulation film which is provided between the reflective electrode and the embedded insulation film; and
    a second insulation film which is provided on the first insulation film and the embedded insulation film, wherein the optical path adjustment layer is disposed such that an end section of at least a portion thereof is positioned on the surface of the second insulation film.

4. The electro-optical apparatus according to claim 3, wherein the second insulation film contains silicon nitride, and
the optical path adjustment layer contains silicon oxide.

5. The electro-optical apparatus according to claim 3, wherein an end section of at least a portion of the optical path adjustment layer is positioned above the embedded insulation film.

6. The electro-optical apparatus according to claim 2, wherein a contact hole is formed which passes through the optical path adjustment layer and the protective layer, and
the second contact electrode has a first contact section which is connected to the reflective electrode in a state of being embedded in the contact hole, and a second contact section which is connected to the first electrode in a state of being disposed on the surface of the protective layer.

7. The electro-optical apparatus according to claim 6, wherein an end section of at least a portion of the optical path adjustment layer is positioned on the surface of the second contact section.

8. An electronic device comprising:
the electro-optical apparatus according to claim 1.

9. An electronic device comprising:
the electro-optical apparatus according to claim 2.

10. An electronic device comprising:
the electro-optical apparatus according to claim 3.

11. An electronic device comprising:
the electro-optical apparatus according to claim 4.

12. An electronic device comprising:
the electro-optical apparatus according to claim 5.

13. An electronic device comprising:
the electro-optical apparatus according to claim 6.

14. An electro-optical apparatus having a first pixel and a second pixel, the electro-optical apparatus comprising:
a substrate;
a counter electrode;
a light-emitting layer disposed between the counter electrode and the substrate;
an optical path adjustment layer disposed between the light-emitting layer and the substrate;
a protective layer disposed between the optical path adjustment layer and the substrate;
a first reflective electrode disposed between the protective layer and the substrate in the first pixel;
a first pixel electrode disposed between the light-emitting layer and the optical path adjustment layer in the first pixel;
a second reflective electrode disposed between the protective layer and the substrate in the second pixel, the surface of the first reflective electrode and second reflective electrode being covered by the protective layer;
a second pixel electrode disposed between the light-emitting layer and the optical path adjustment layer in the second pixel;
an embedded insulation film disposed between the first reflective electrode and second reflective electrode,
wherein a reflection enhancing layer is disposed on the surface of at least one of the first reflective electrode and the second reflective electrode so as to directly contact the surface of the at least one of the first reflective electrode and the second reflective electrode.

15. The electro-optical apparatus according to claim 14, wherein the embedded insulation film is disposed between the protective layer and at least part of the optical path adjustment layer.

16. The electro-optical apparatus according to claim 14, wherein an end section of at least a portion of the optical path adjustment layer is positioned above the embedded insulation film.

17. An electronic device comprising:
the electro-optical apparatus according to claim 14.

18. An electronic device comprising:
the electro-optical apparatus according to claim 15.

19. An electronic device comprising:
the electro-optical apparatus according to claim 16.

* * * * *